United States Patent
Yamane et al.

(10) Patent No.: US 12,355,427 B2
(45) Date of Patent: Jul. 8, 2025

(54) ACOUSTIC WAVE DEVICE

(71) Applicant: Murata Manufacturing Co., Ltd., Nagaokakyo (JP)

(72) Inventors: Takashi Yamane, Nagaokakyo (JP); Yuta Ishii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 253 days.

(21) Appl. No.: 18/096,614

(22) Filed: Jan. 13, 2023

(65) Prior Publication Data

US 2023/0141873 A1    May 11, 2023

Related U.S. Application Data

(63) Continuation of application No. PCT/JP2021/025976, filed on Jul. 9, 2021.

(60) Provisional application No. 63/052,144, filed on Jul. 15, 2020.

(51) Int. Cl.
| | |
|---|---|
| H03H 9/58 | (2006.01) |
| H03H 9/13 | (2006.01) |
| H03H 9/205 | (2006.01) |
| H03H 9/60 | (2006.01) |

(52) U.S. Cl.
CPC ............ *H03H 9/587* (2013.01); *H03H 9/133* (2013.01); *H03H 9/205* (2013.01); *H03H 9/605* (2013.01)

(58) Field of Classification Search
CPC ........ H03H 9/587; H03H 9/133; H03H 9/205; H03H 9/605; H03H 9/02015; H03H 9/02047; H03H 9/02157; H03H 9/02228

USPC .................................. 333/186–188, 193–196
See application file for complete search history.

(56) References Cited

U.S. PATENT DOCUMENTS

| | | | |
|---|---|---|---|
| 10,715,105 B2 * | 7/2020 | Kishimoto | H03H 9/175 |
| 2007/0200459 A1 | 8/2007 | Yoshino et al. | |
| 2012/0313483 A1 | 12/2012 | Matsuda et al. | |
| 2019/0207583 A1 | 7/2019 | Miura et al. | |
| 2020/0328728 A1 | 10/2020 | Nakagawa et al. | |
| 2022/0014172 A1 | 1/2022 | Nozoe | |

FOREIGN PATENT DOCUMENTS

| | | |
|---|---|---|
| JP | 2007228341 A | 9/2007 |
| JP | 2011182096 A | 9/2011 |
| JP | 2012257019 A | 12/2012 |
| JP | 2019121880 A | 7/2019 |

(Continued)

OTHER PUBLICATIONS

International Search Report in PCT/JP2021/025976, mailed Aug. 31, 2021, 4 pages.

(Continued)

*Primary Examiner* — Jorge L Salazar, Jr.
(74) *Attorney, Agent, or Firm* — Keating & Bennett, LLP

(57) ABSTRACT

An acoustic wave device includes a support substrate, a piezoelectric layer on the support substrate, functional electrodes on the piezoelectric layer, and first and second electrode films positioned on the piezoelectric layer to face each other and having different potentials from each other. A thickness of the piezoelectric layer in at least a portion of a first region overlapping the first electrode film in plan view is different from a thickness of the piezoelectric layer in at least a portion of a second region not overlapping the first electrode film in plan view.

19 Claims, 15 Drawing Sheets

(56) References Cited

FOREIGN PATENT DOCUMENTS

| JP | 2019186655 A | 10/2019 |
|----|--------------|---------|
| WO | 2017208866 A1 | 12/2017 |
| WO | 2019138810 A1 | 7/2019 |
| WO | 2020100949 A1 | 5/2020 |

OTHER PUBLICATIONS

Written Opinion in PCT/JP2021/025976, mailed Aug. 31, 2021, 4 pages.

\* cited by examiner

ACOUSTIC WAVE DEVICE

This application claims the benefit of priority to U.S. Provision Application No. 63/052,144 filed on Jul. 15, 2020 and is a Continuation Application of PCT Application No. PCT/JP2021/025976 filed on Jul. 9, 2021. The entire contents of each application are hereby incorporated herein by reference.

BACKGROUND OF THE INVENTION

1. Field of the Invention

The present invention relates to an acoustic wave device.

2. Description of the Related Art

In the related art, an acoustic wave device that uses plate waves propagating in a piezoelectric film made of $LiNbO_3$ or $LiTaO_3$ is known. For example, Japanese Unexamined Patent Application Publication No. 2012-257019 discloses an acoustic wave device that uses a Lamb wave which is a type of plate wave. In this acoustic wave device, a piezoelectric substrate is disposed on a support. The piezoelectric substrate is made of $LiNbO_3$ or $LiTaO_3$. An interdigital transducer (IDT) electrode is disposed on the upper surface of the piezoelectric substrate. A voltage is applied between a plurality of electrode fingers of the IDT electrode that are connected to one potential and a plurality of electrode fingers of the IDT electrode that are connected to another potential. This excites the Lamb wave. Reflectors are arranged on both sides of the IDT electrode. As a result, an acoustic wave resonator that uses plate waves is formed.

Japanese Unexamined Patent Application Publication No. 2011-182096 discloses an example of a ladder filter. In this ladder filter, a plurality of acoustic wave devices are connected by a plurality of wiring lines. The plurality of wiring lines include a wiring line connected to a hot potential and a wiring line connected to a ground potential. The wiring line connected to the hot potential and the wiring line connected to the ground potential face each other.

In an acoustic wave resonator such as that disclosed in Japanese Unexamined Patent Application Publication No. 2012-257019, an unwanted bulk wave may sometimes be excited. The bulk wave propagates in the thickness direction of a piezoelectric substrate. Thus, the bulk wave may sometimes be reflected by a support. In a configuration, such as that described in Japanese Unexamined Patent Application Publication No. 2011-182096, in which wiring lines that are connected to different potentials from each other face each other, an unwanted bulk-wave signal may sometimes be extracted by one of the wiring lines. Alternatively, an unwanted bulk-wave signal may sometimes be extracted by one of busbars that face each other. In such cases, there is a possibility that a ripple may occur in the frequency characteristics of the acoustic wave device.

SUMMARY OF THE INVENTION

Preferred embodiments of the present invention provide acoustic wave devices that are each able to reduce or prevent a ripple in frequency characteristics.

An acoustic wave device according to a preferred embodiment of the present invention includes a support substrate, a piezoelectric layer on the support substrate, a functional electrode on the piezoelectric layer, and first and second electrode films positioned on the piezoelectric layer to face each other and having different potentials from each other. A thickness of the piezoelectric layer in at least a portion of a region overlapping the first electrode film in plan view is different from a thickness of the piezoelectric layer in at least a portion of a region not overlapping the first electrode film in plan view.

According to preferred embodiments of the present invention, acoustic wave devices that are each able to reduce or prevent a ripple in frequency characteristics can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings to clarify the present invention.

The preferred embodiments described in the present specification are examples, and the configurations according to the different preferred embodiments may be partially replaced or combined with one another.

Figure 1:
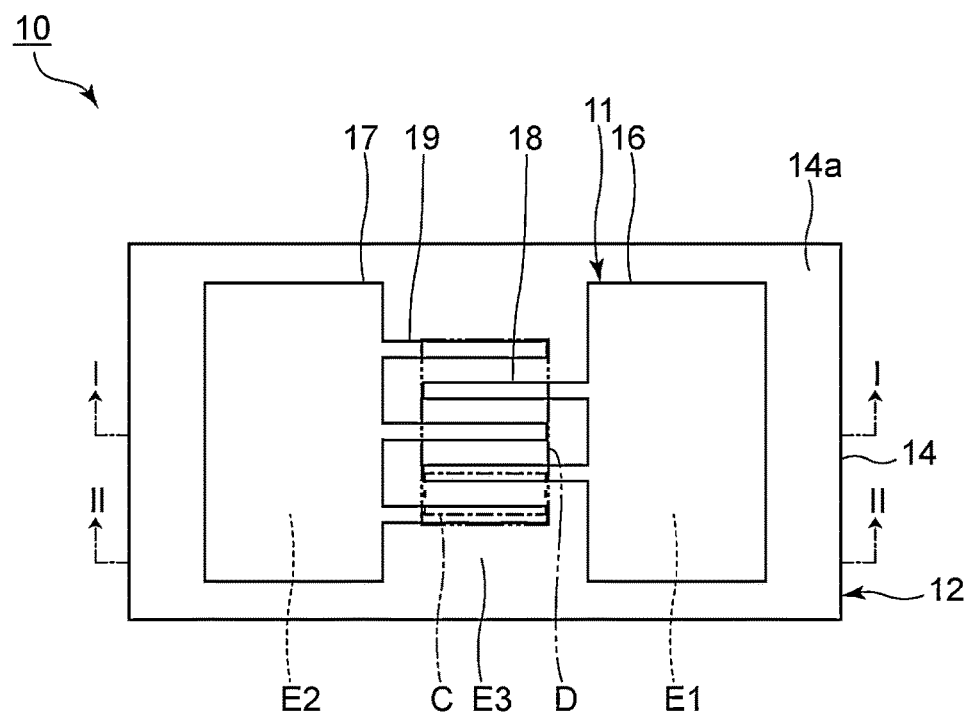
FIG. 1 is a plan view of an acoustic wave device according to a first preferred embodiment of the present invention.
Figure 2:
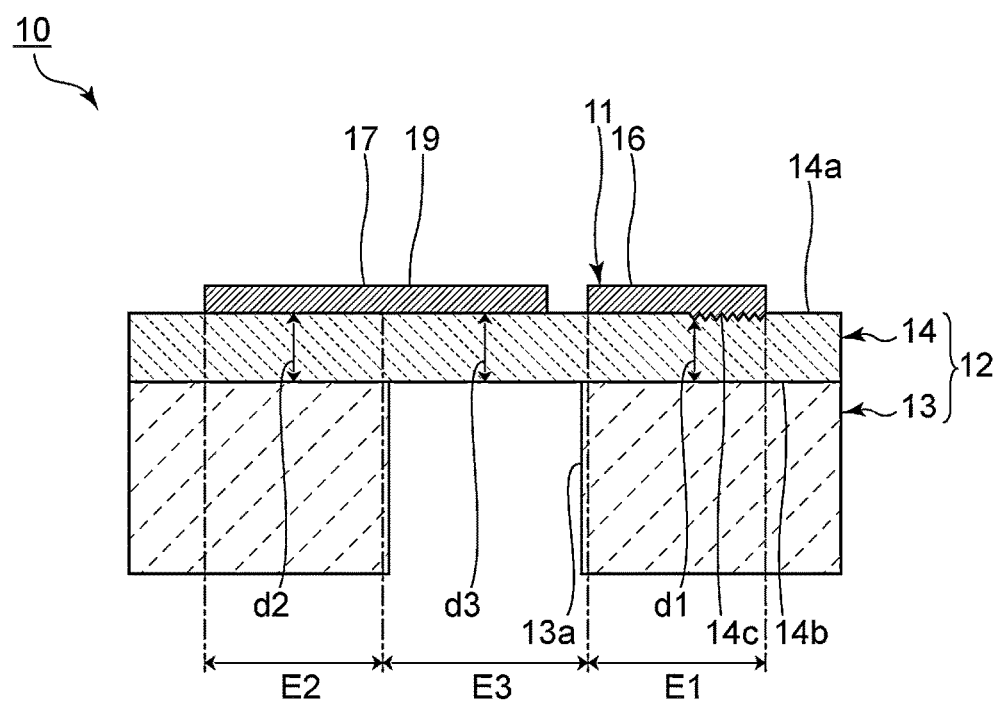
FIG. 2 is a sectional view taken along line I-I of FIG. 1.
Figure 3:
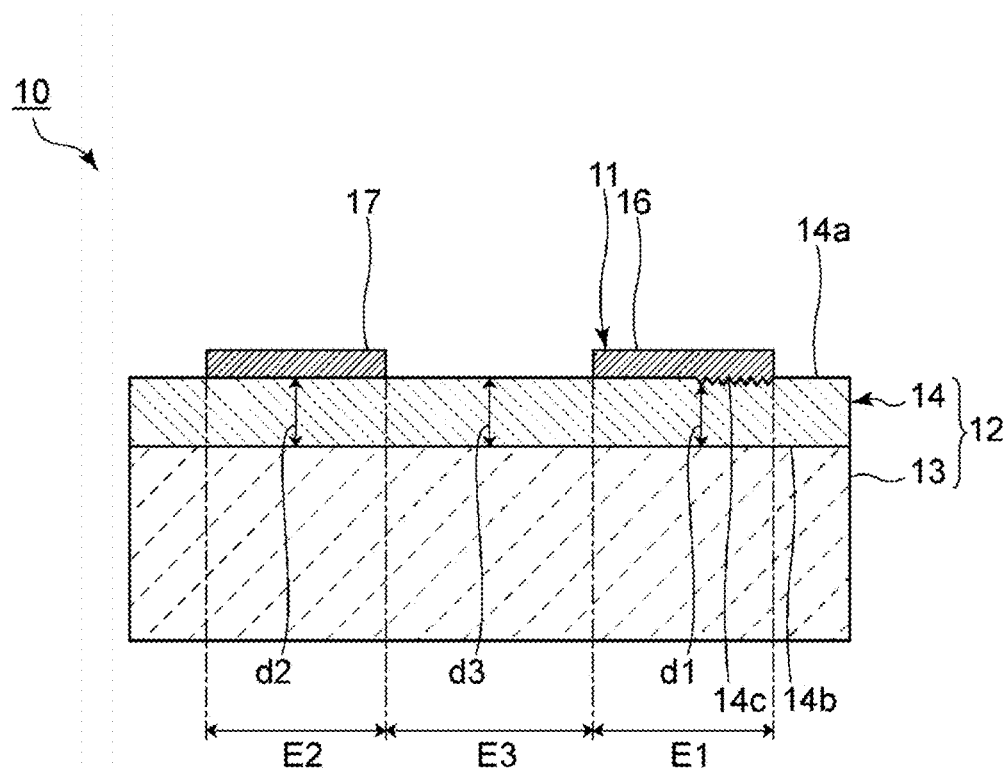
FIG. 3 is a sectional view taken along line II-II of FIG. 1.

FIG. 1 is a plan view of an acoustic wave device according to the first preferred embodiment of the present invention. FIG. 2 is a sectional view taken along line I-I of FIG. 1. FIG. 3 is a sectional view taken along line II-II of FIG. 1.

As illustrated in FIG. 1, an acoustic wave device 10 includes a piezoelectric substrate 12 and an interdigital transducer (IDT) electrode 11. As illustrated in FIG. 2, the piezoelectric substrate 12 includes a support member 13 and a piezoelectric layer 14. In the present preferred embodiment, the support member 13 includes only a support substrate. However, the support member 13 may include, for example, a multilayer body including the support substrate and an insulating layer.

The support member 13 includes a through hole 13a as a cavity portion. The piezoelectric layer 14 covers the through hole 13a of the support member 13.

In the present preferred embodiment, the piezoelectric layer 14 is, for example, a lithium niobate layer. More specifically, the piezoelectric layer 14 is, for example, a $LiNbO_3$ layer. However, the piezoelectric layer 14 may be, for example, a lithium tantalate layer such as a $LiTaO_3$ layer.

In the present preferred embodiment, the support substrate is, for example, a silicon substrate. However, the material of the support substrate is not limited to the above.

Returning to FIG. 1, the IDT electrode 11 is disposed on the piezoelectric layer 14. The IDT electrode 11 includes a first busbar 16, a second busbar 17, a plurality of first electrode fingers 18, and a plurality of second electrode fingers 19. The first busbar 16 corresponds to a first electrode film. The second busbar 17 corresponds to a second electrode film. As illustrated in FIG. 3, the first busbar 16 and the second busbar 17 face each other.

In the present preferred embodiment, a portion of the piezoelectric layer 14 on which the first busbar 16 is disposed includes an uneven portion 14c. More specifically, a portion of a first main surface 14a of the piezoelectric layer 14 on which the first busbar 16 is disposed partially has a rough surface. The thickness of the piezoelectric layer 14 at the depressions of the uneven portion 14c is smaller than the thickness of a portion of the piezoelectric layer 14 that does not have the uneven portion 14c.

The first busbar 16 and the second busbar 17 are connected to different potentials from each other. In the present preferred embodiment, the first busbar 16 is connected to a ground potential, and the second busbar 17 is connected to a hot potential. However, the first busbar 16 is not limited to being connected to the ground potential, and the second busbar 17 is not limited to being connected to the hot potential. For example, the first busbar 16 may be connected to the hot potential, and the second busbar 17 may be connected to the ground potential.

The plurality of first electrode fingers 18 and the plurality of second electrode fingers 19 illustrated in FIG. 1 correspond to at least one pair of electrodes. The at least one pair of electrodes face each other. More specifically, the first electrode fingers 18 corresponds to a first electrode. The plurality of first electrode fingers 18 are arranged at regular intervals. An end of each of the plurality of first electrode fingers 18 is connected to the first busbar 16. The second electrode fingers 19 corresponds to a second electrode. The plurality of second electrode fingers 19 are arranged at regular intervals. An end of each of the plurality of second electrode fingers 19 is connected to the second busbar 17. The plurality of first electrode fingers 18 and the plurality of second electrode fingers 19 are interdigitated with one another. In the following description, the first electrode fingers 18 and the second electrode fingers 19 will sometimes be simply referred to as electrode fingers. The IDT electrode 11 may include a single metal film or may be a multilayer metal film.

In the acoustic wave device 10, the plurality of electrode fingers corresponding to the at least one pair of electrodes correspond to at least one functional electrode. An acoustic wave is excited by applying an alternating-current (AC) voltage to the at least one functional electrode of the IDT electrode 11. In the present preferred embodiment, the acoustic wave device 10 uses a thickness-shear mode bulk wave. More specifically, the acoustic wave device 10 uses a bulk wave in a first thickness-shear mode as a main wave. The acoustic wave device 10 may be, for example, an acoustic wave device that uses a plate wave, such as Lamb wave, as a main wave. In the present preferred embodiment, a shear horizontal (SH) wave is excited as an unwanted bulk wave.

Here, a direction in which the first electrode fingers 18 and the second electrode fingers 19 face one another in plan view will be referred to as an electrode-finger facing direction. The phrase "in plan view" refers to viewing from above in FIG. 2, FIG. 3, or the like. A region in which the adjacent electrode fingers overlap one another when viewed in the electrode-finger facing direction is an intersecting region D. The intersecting region D is a region including all of the electrode fingers of the IDT electrode 11 including the two endmost electrode fingers in the electrode-finger facing direction. More specifically, the intersecting region D includes the outer end edge of one of the endmost electrode fingers and the outer end edge of the other endmost electrode finger in the electrode-finger facing direction.

In addition, the acoustic wave device 10 includes a plurality of excitation regions C. The excitation regions C are also regions in which the adjacent electrode fingers face each other when viewed in the electrode-finger facing direction. Each of the excitation regions C is defined between a corresponding two of the electrode fingers. More specifically, each of the excitation regions C is a region extending from the center of one of the corresponding pair of electrode fingers to the center of the other of the corresponding pair of electrode fingers in the electrode-finger facing direction. Accordingly, the plurality of the excitation regions C are included in the intersecting region D. The thickness-shear mode bulk wave is excited in each of the excitation regions C. In contrast, in the case where the acoustic wave device 10 uses a plate wave, the intersecting region D defines and functions as an excitation region.

The piezoelectric layer 14 includes a first region E1, a second region E2, and a third region E3. The first region E1 is a region overlapping the first electrode film in plan view. The second region E2 is a region overlapping the second electrode film in plan view. The third region E3 is a region not overlapping either the first electrode film or the second electrode film in plan view. The thickness of the piezoelectric layer 14 in the first region E1 is denoted by d1. The thickness of the piezoelectric layer 14 in the second region E2 is denoted by d2. The thickness of the piezoelectric layer 14 in the third region E3 is denoted by d3. As illustrated in FIG. 2, the thickness d2 and the thickness d3 are the same or substantially the same as each other.

One of the unique features of the present preferred embodiment is that the thickness d1 in at least a portion of the first region E1 is different from the thickness of the piezoelectric layer 14 in at least portion of the other regions excluding the first region E1. More specifically, in the present preferred embodiment, the thickness d1 in a portion of the first region E1 is different from the thickness d2 in the second region E2 and different from the thickness d3 in the third region E3. The thickness d1 in a portion of the first region E1 is smaller than the thickness d2 and smaller than the thickness d3. As a result, in the acoustic wave device 10, the influence of an unwanted bulk wave on frequency characteristics can be reduced or prevented, and the ripple in the frequency characteristics can be reduced or prevented. This matter will be described below by comparing the present preferred embodiment and a comparative example.

The difference between the first preferred embodiment and the comparative example is that the thickness of a piezoelectric layer in the comparative example is uniform in all of the first to third regions. In the first preferred embodiment, a reflection characteristic, which is one of the frequency characteristics, between the first busbar and the second busbar was measured. Similarly, in the comparative example, a reflection characteristic between a first busbar and a second busbar was measured.

Figure 4:
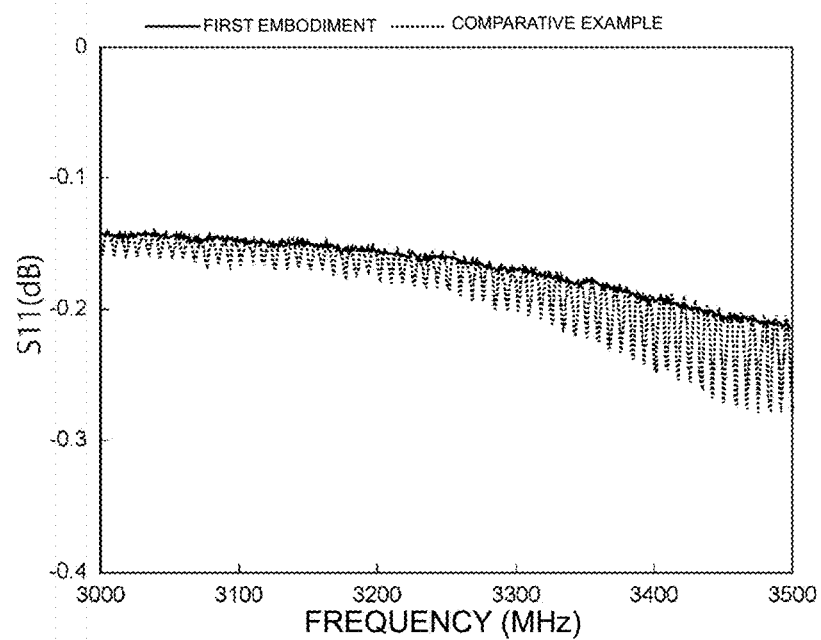
FIG. 4 is a graph illustrating a reflection characteristic in the first preferred embodiment of the present invention and a reflection characteristic in a comparative example.
Figure 5:
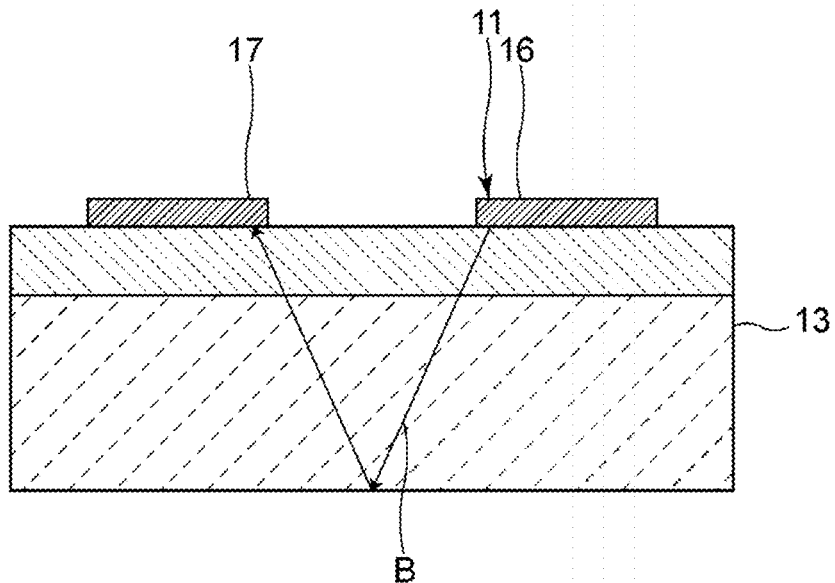
FIG. 5 is a sectional view illustrating a case in which an unwanted bulk wave propagates.

FIG. 4 is a graph illustrating a reflection characteristic in the first preferred embodiment and a reflection characteristic in a comparative example. Each of the reflection characteristics illustrated in FIG. 4 is the relationship between S11 and frequency. FIG. 5 is a sectional view illustrating a case in which an unwanted bulk wave propagates in the comparative example. In FIG. 5, a portion of the unwanted bulk wave is indicated by arrow B.

As illustrated in FIG. 4, in the reflection characteristic in the comparative example, it is understood that a ripple has occurred in the entire or substantially the entire frequency band illustrated in FIG. 4. In the comparative example, for example, as illustrated in FIG. 5, the unwanted bulk wave propagated from the first busbar 16 is reflected by the support substrate. The signal of the unwanted bulk wave is extracted by the second busbar 17. This causes the ripple illustrated in FIG. 4 to occur. In contrast, it is understood that the ripple in the reflection characteristic in the first preferred embodiment is reduced or prevented.

For example, when an unwanted bulk wave propagates from the first busbar 16 defining and functioning as the first electrode film to the second busbar 17 defining and functioning as the second electrode film, a portion of the unwanted bulk wave passes through the first region E1. Another portion of the bulk wave passes through the first region E1 and the third region E3. The unwanted bulk wave also passes through the second region E2. In the first preferred embodiment, the uneven portion 14c is provided in a portion of the first region E1 of the piezoelectric layer 14. On the other hand, the uneven portion 14c is not provided in either the second region E2 or the third region E3. Thus, the thickness of the piezoelectric layer 14 at the depressions of the uneven portion 14c is different from the thickness of the piezoelectric layer 14 in the second region E2 and different from the thickness of the piezoelectric layer 14 in the third region E3. As a result, the propagation mode of the unwanted bulk wave in the first region E1 can be set to be different from that in each of the second and third regions E2 and E3. Consequently, uniform propagation of the unwanted bulk wave between the first electrode film and the second electrode film can be reduced or prevented. Therefore, the influence of the unwanted bulk wave on the reflection characteristic can be reduced or prevented, and the ripple in the reflection characteristic can be reduced or prevented.

It is preferable that the surface roughness of the uneven portion 14c of the piezoelectric layer 14 is, for example, about 0.2 nm or greater. In this case, the influence of an unwanted bulk wave on the reflection characteristic, which is one of the frequency characteristics, can be effectively reduced or prevented. In the present specification, the surface roughness is based on arithmetic mean roughness Ra defined in JIS B 0601:2001.

As illustrated in FIG. 3, it is preferable that the thickness d1 of the piezoelectric layer 14 in at least a portion of the first region E1 is different from at least a portion of the thickness d3 of the piezoelectric layer 14 in a portion of the third region E3, the portion of the third region E3 being located between the first electrode film and the second electrode film. Similarly, it is preferable that the thickness d1 of the piezoelectric layer 14 in at least a portion of the first region E1 is different from at least a portion of the thickness d2 of the piezoelectric layer 14 in the second region E2. In other words, it is preferable that the acoustic wave device according to a preferred embodiment of the present invention has a configuration in which the thickness d1 of the piezoelectric layer 14 in at least a portion of the first region E1 is different from the thickness of the piezoelectric layer 14 in at least a portion of a region formed of a region overlapping the space between the first electrode film and the second electrode film in plan view and the second region E2. As a result, the influence of an unwanted bulk wave on the frequency characteristics can be reduced or prevented with higher certainty, and the ripple in the frequency characteristics can be reduced or prevented with higher certainty.

Returning to FIG. 1, in the first preferred embodiment, the support member 13 includes only the support substrate. However, the support member 13 may be a multilayer body including the support substrate and an insulating layer. In this case, the piezoelectric layer 14 is provided on the insulating layer. For example, as the material of the insulating layer, a silicon oxide layer, silicon nitride, tantalum oxide, or the like can be used.

The cavity portion is not limited to being a through hole. The cavity portion may be, for example, a hollow portion. The hollow portion includes, for example, a recess in the support member. More specifically, the recess is sealed with, for example, the piezoelectric layer 14, so that the hollow portion is provided. Alternatively, the piezoelectric layer 14 may include a recess that is open toward the support member 13. This recess may define the cavity portion. In this case, it is not necessary to provide a recess or a through hole in the support member 13.

As described above, at least one of the thickness d1 in at least a portion of the first region E1 and the thickness d2 in at least a portion of the second region E2 may be different from the thickness d3 in at least a portion of the third region E3. First and second modifications of the first preferred embodiment will be described below. The only difference between the first preferred embodiment and each of the first and second modifications is a portion in which the uneven portion 14c is provided. The ripple in the frequency characteristics can be reduced or prevented in both the first modification and the second modification.

Figure 6:
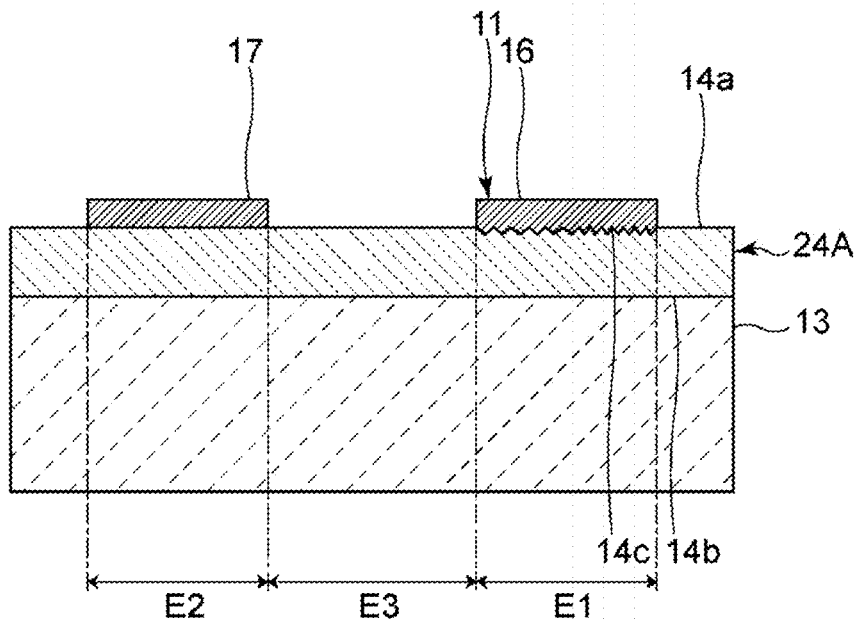
FIG. 6 is a sectional view illustrating a portion of an acoustic wave device according to a first modification of the first preferred embodiment of the present invention, the portion corresponding to the sectional view illustrated in FIG. 3.

In the first modification illustrated in FIG. 6, the uneven portion 14c is provided in the entire or substantially the entire first region E1 of a piezoelectric layer 24A. The first region E1 may include a plurality of regions. There may be variations in the surface roughness of the uneven portion 14c among the plurality of regions.

Figure 7:
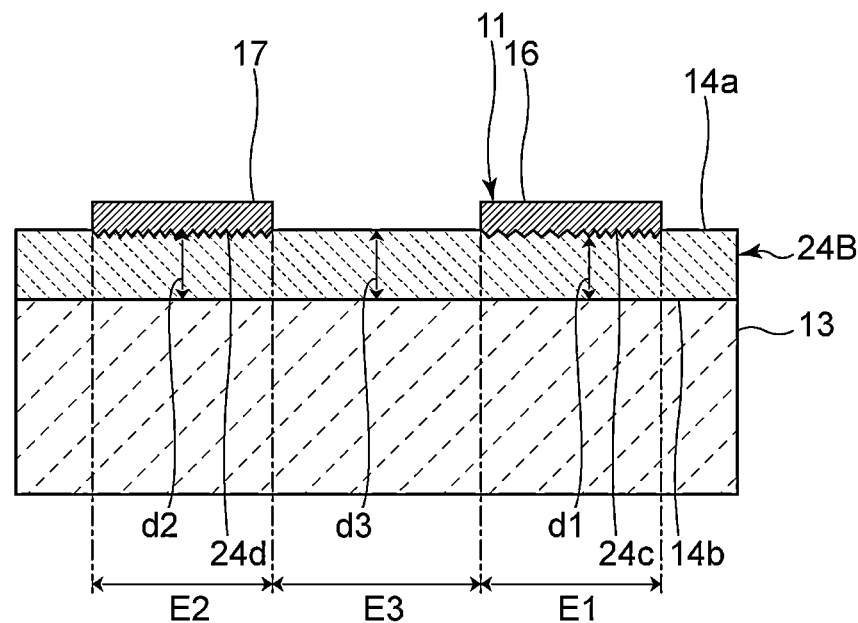
FIG. 7 is a sectional view illustrating a portion of an acoustic wave device according to a second modification of the first preferred embodiment of the present invention, the portion corresponding to the sectional view illustrated in FIG. 3.

In the second modification illustrated in FIG. 7, an uneven portion is provided in the entire or substantially the entire first region E1 and the entire or substantially the entire second region E2 of a piezoelectric layer 24B. The uneven portion in the first region E1 is a first uneven portion 24c. The uneven portion in the second region E2 is a second uneven portion 24d. Thus, the thickness d1 in a portion of the first region E1 and the thickness d2 in a portion of the second region E2 are both different from the thickness d3 in the third region E3.

The surface roughness of the first uneven portion 24c and the surface roughness of the second uneven portion 24d may be different from each other. Alternatively, as in the first modification, the first region E1 may include a plurality of regions. In this case, the surface roughness of the second uneven portion 24d may be different from the surface roughness of the first uneven portion 24c in at least one of the above-mentioned plurality of regions included in the first region E1.

A dielectric film may be provided between the piezoelectric layer and at least one of the first electrode film and the second electrode film. Third to fifth modifications of the first preferred embodiment will be described below. The only differences between the first preferred embodiment and each of the third to fifth modifications are the dielectric film provided in each of the third to fifth modifications and the arrangement of the uneven portion.

Figure 8:
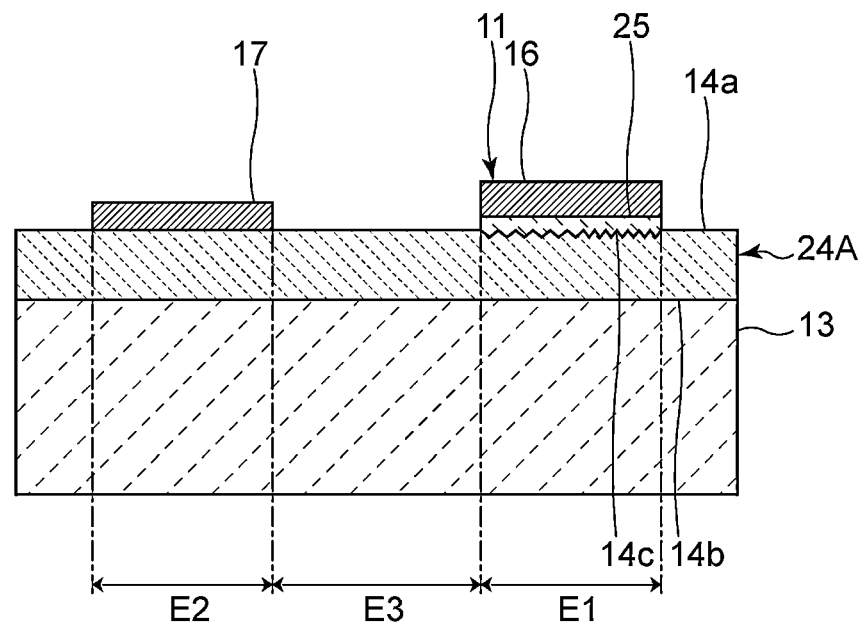
FIG. 8 is a sectional view illustrating a portion of an acoustic wave device according to a third modification of the first preferred embodiment of the present invention, the portion corresponding to the sectional view illustrated in FIG. 3.

In the third modification illustrated in FIG. 8, as in the first modification, the uneven portion 14c is provided in the entire or substantially the entire first region E1 of the piezoelectric layer 24A. In addition, a dielectric film 25 is provided between the piezoelectric layer 24A and the first busbar 16 defining and functioning as the first electrode film. On the other hand, the dielectric film 25 is not provided between the piezoelectric layer 24A and the second busbar 17 defining and functioning as the second electrode film. The dielectric film 25 is not provided between the piezoelectric layer 24A and a portion of the IDT electrode 11, the portion being located between the first busbar 16 and the second busbar 17. By providing the dielectric film 25, the electromechanical coupling coefficient changes compared with the case where the dielectric film 25 is not provided. In the present modification, the dielectric film 25 is provided, so that the electromechanical coupling coefficient changes in the first region E1. As a result, the propagation mode of an unwanted bulk wave in the first region E1 and the propagation mode of an unwanted bulk wave in the third region E3 can be set to be different from each other. Therefore, the ripple in the frequency characteristics can be further reduced or prevented.

For example, as the material of the dielectric film 25, a silicon oxide, silicon nitride, a resin, or the like can be used.

Figure 9:
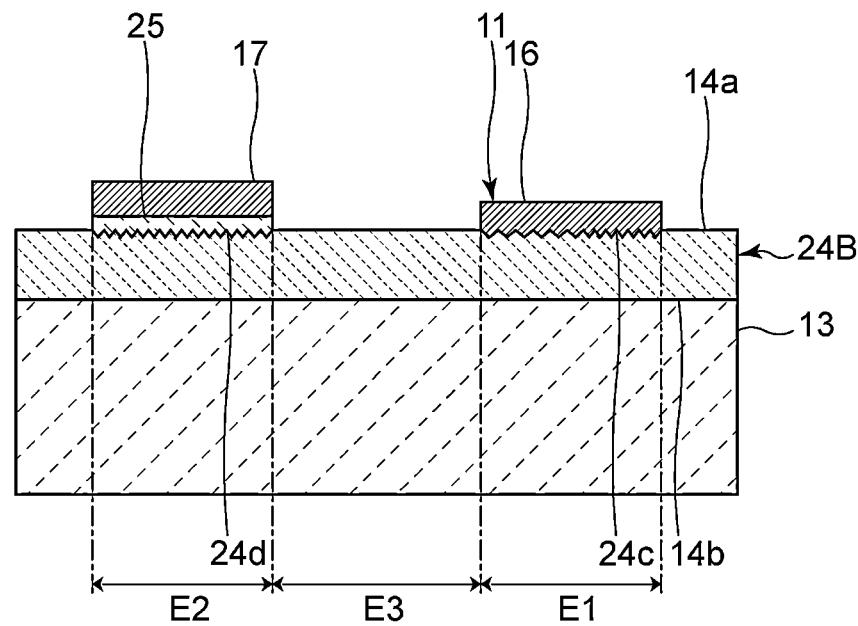
FIG. 9 is a sectional view illustrating a portion of an acoustic wave device according to a fourth modification of the first preferred embodiment of the present invention, the portion corresponding to the sectional view illustrated in FIG. 3.

In the fourth modification illustrated in FIG. 9, as in the second modification, the first uneven portion 24c is provided in the entire or substantially the entire first region E1 of the piezoelectric layer 24B. In addition, the second uneven portion 24d is provided in the entire or substantially the entire second region E2. Furthermore, the dielectric film 25 is provided between the piezoelectric layer 24B and the second busbar 17. On the other hand, the dielectric film 25 is not provided between the piezoelectric layer 24B and the first busbar 16.

Figure 10:
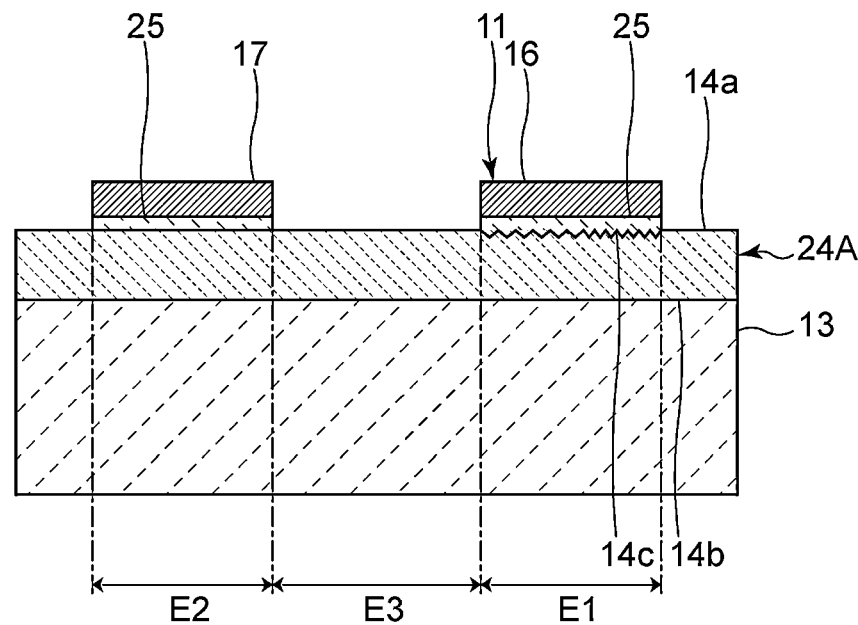
FIG. 10 is a sectional view illustrating a portion of an acoustic wave device according to a fifth modification of the first preferred embodiment of the present invention, the portion corresponding to the sectional view illustrated in FIG. 3.

In the fifth modification illustrated in FIG. 10, as in the first modification, the uneven portion 14c is provided in the entire or substantially the entire first region E1 of the piezoelectric layer 24A. In addition, the dielectric film 25 is provided between the piezoelectric layer 24A and the first busbar 16 and between the piezoelectric layer 24A and the second busbar 17.

Figure 11:
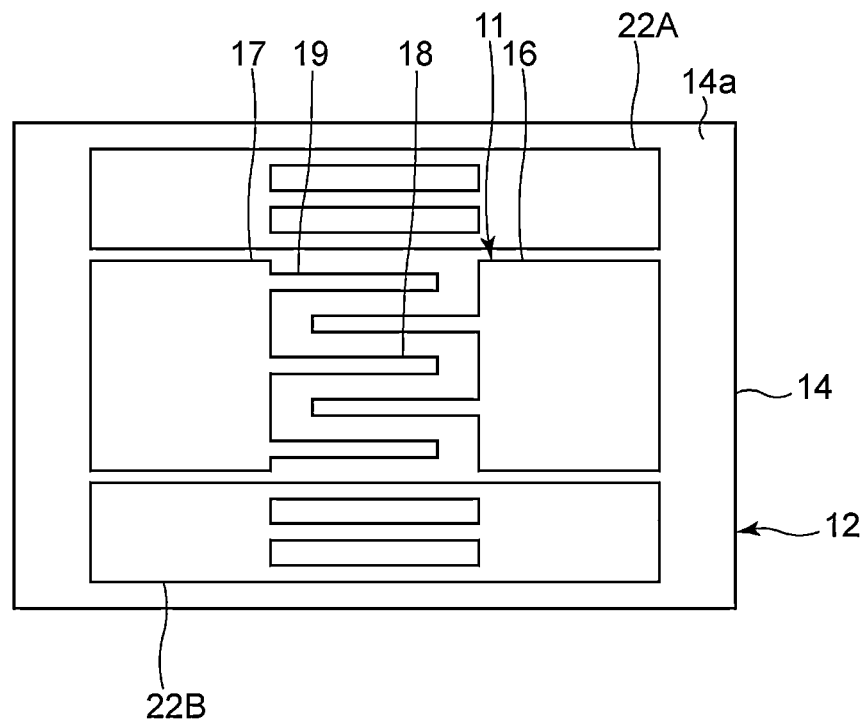
FIG. 11 is a plan view of an acoustic wave device according to a sixth modification of the first preferred embodiment of the present invention.

FIG. 11 illustrates, as a sixth modification of the first preferred embodiment, a case in which an acoustic wave device uses a plate wave. As illustrated in FIG. 11, in plan view, a pair of reflectors 22A and 22B are provided such that one of them is located on one side of the IDT electrode 11, which is disposed on the piezoelectric layer 14, and the other is located on the other side of the IDT electrode 11 in the electrode-finger facing direction. This can suitably improve resonance characteristics in the case of using a plate wave. Also in the present modification, the configurations of the piezoelectric layer 14, the first busbar 16 defining and functioning as the first electrode film, and the second busbar 17 defining and functioning as the second electrode film are the same as or similar to those of the first preferred embodiment. Thus, the ripple in the frequency characteristics can be reduced or prevented.

Figure 12:
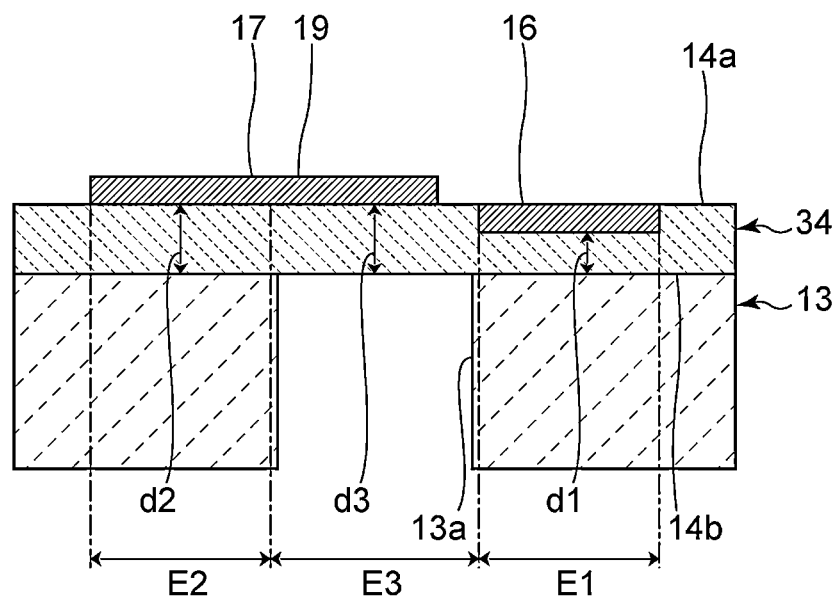
FIG. 12 is a sectional view illustrating a portion of an acoustic wave device according to a second preferred embodiment of the present invention, the portion corresponding to the sectional view illustrated in FIG. 2.

FIG. 12 is a sectional view illustrating a portion of an acoustic wave device according to a second preferred embodiment of the present invention, the portion corresponding to the sectional view illustrated in FIG. 2.

The present preferred embodiment is different from the first preferred embodiment is that a piezoelectric layer 34 does not include an uneven portion. Another difference between the present preferred embodiment and the first preferred embodiment is that the thickness d1 of the piezoelectric layer 34 in the entire or substantially the entire first region E1 is different from the thickness d3 of the piezoelectric layer 34 in the third region E3. The acoustic wave device of the present preferred embodiment has a configuration the same as or similar to that of the acoustic wave device 10 of the first preferred embodiment except with regard to the above-described differences.

More specifically, the thickness d1 of the piezoelectric layer 34 in the entire or substantially the entire first region E1 is smaller than the thickness d3 of the piezoelectric layer 34 in the third region E3. In addition, the thickness d1 is smaller than the thickness d2 of the piezoelectric layer 34 in the second region E2. The thickness d2 and the thickness d3 are the same or substantially the same as each other. Also in the present preferred embodiment, the propagation mode of an unwanted bulk wave in the first region E1 and the propagation mode of an unwanted bulk wave in the third region E3 can be set to be different from each other as in the first preferred embodiment. Therefore, the influence of an unwanted bulk wave on the frequency characteristics can be reduced or prevented, and the ripple in the frequency characteristics can be reduced or prevented.

As in the present preferred embodiment, it is preferable that the thickness d1 in the entire or substantially the entire first region E1 and the thickness d2 in the entire or substantially the entire second region E2 are different from each other. As a result, the propagation mode of a bulk wave in the first region E1 and the propagation mode of a bulk wave in the second region E2 can be set to be different from each other. Therefore, the influence of an unwanted bulk wave on the frequency characteristics can be further reduced or prevented, and the ripple in the frequency characteristics can be further reduced or prevented.

First and second modifications of the second preferred embodiment will be described below. The ripple in the frequency characteristics can be reduced or prevent in both the first modification and the second modification as in the second preferred embodiment.

Figure 13:
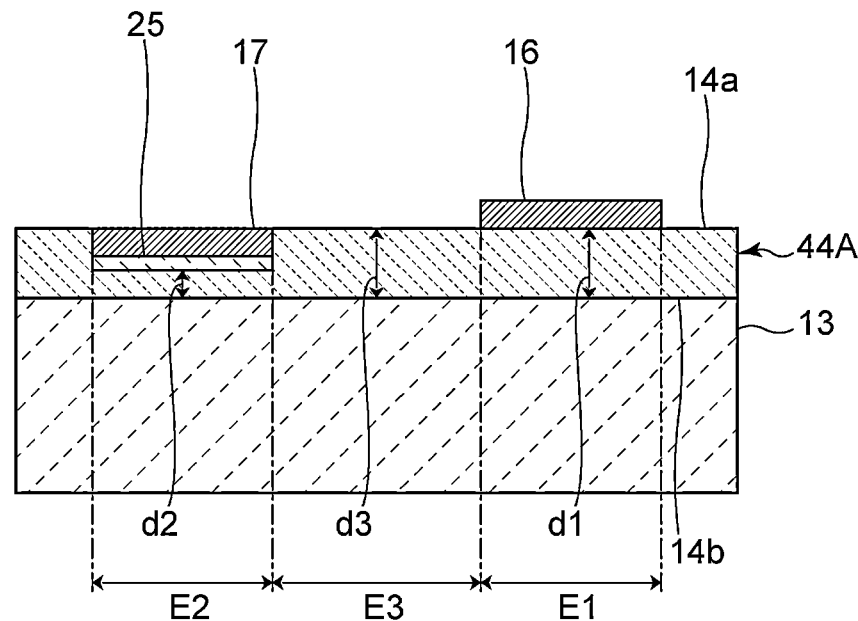
FIG. 13 is a sectional view illustrating a portion of an acoustic wave device according to a first modification of the second preferred embodiment of the present invention, the portion corresponding to the sectional view illustrated in FIG. 3.

In the first modification illustrated in FIG. 13, the thickness d2 of a piezoelectric layer 44A in the entire or substantially the entire second region E2 is smaller than the thickness d3 of the piezoelectric layer 44A in the third region E3. In contrast, the thickness d1 of the piezoelectric layer 44A in the first region E1 is the same or substantially the same as the thickness d3 of the piezoelectric layer 44A. In addition, the dielectric film 25 is provided between the piezoelectric layer 44A and the second busbar 17. On the other hand, the dielectric film 25 is not provided between the piezoelectric layer 44A and the first busbar 16. The dielectric film 25 may be provided between the piezoelectric layer 44A and at least one of the first busbar 16 defining and functioning as the first electrode film and the second busbar 17 defining and functioning as the second electrode film.

Figure 14:
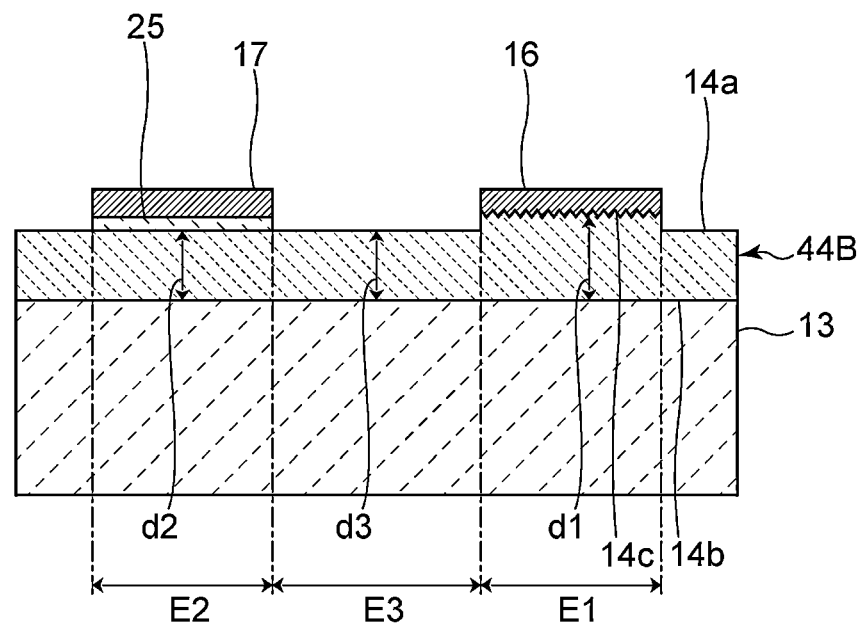
FIG. 14 is a sectional view illustrating a portion of an acoustic wave device according to a second modification of the second preferred embodiment of the present invention, the portion corresponding to the sectional view illustrated in FIG. 3.

In the second modification illustrated in FIG. 14, the thickness d1 of a piezoelectric layer 44B in the entire or substantially the entire first region E1 is larger than the thickness d3 of the piezoelectric layer 44B in the third region E3. In addition, the uneven portion 14c is provided in the entire or substantially the entire first region E1. The thickness d2 of the piezoelectric layer 44B in the second region E2 is the same or substantially the same as the thickness d3 of the piezoelectric layer 44B. The uneven portion 14c may be provided in at least one of the first region E1 and the second region E2 of the piezoelectric layer 44B. In addition, the dielectric film 25 is provided between the piezoelectric layer 44B and the second busbar 17. On the other hand, the dielectric film 25 is not provided between the piezoelectric layer 44B and the first busbar 16.

In the first preferred embodiment, the case has been described in which a signal of an unwanted bulk wave propagated from one of the pair of busbars is extracted by the other of the pair of busbars and in which the influence of this signal can be suppressed. Propagation and extraction of a signal of an unwanted bulk wave may sometimes occur also between wiring electrode films in a filter device. A third preferred embodiment of the present invention will be described below in which an acoustic wave device is a filter device.

Figure 15:
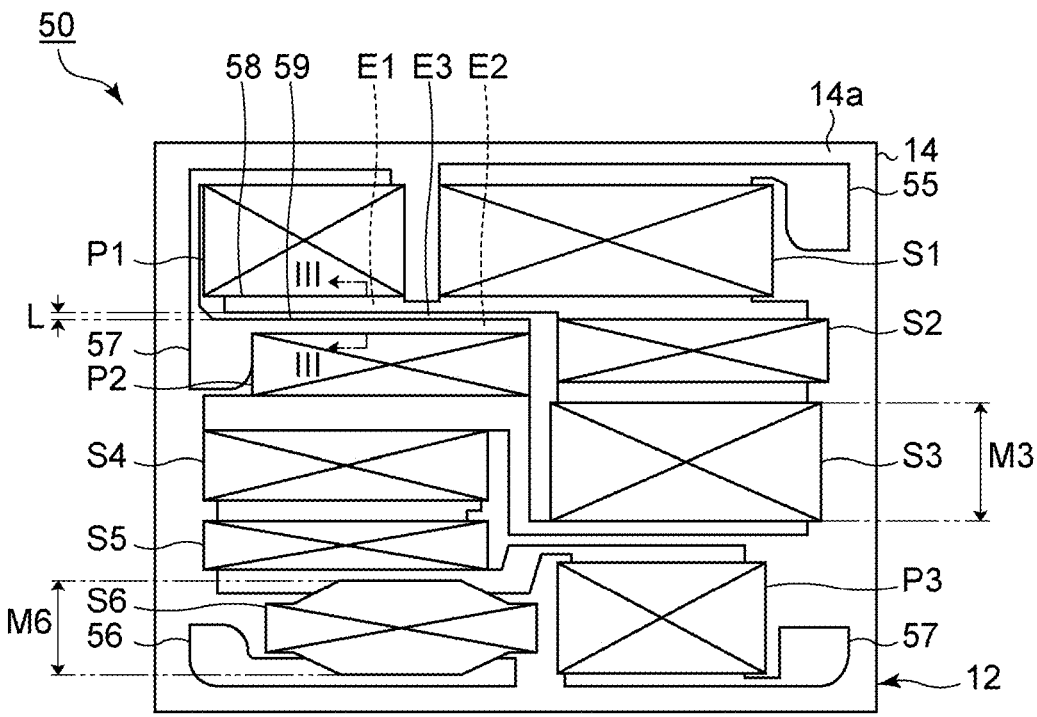
FIG. 15 is a schematic plan view of an acoustic wave device according to a third preferred embodiment of the present invention.

FIG. 15 is a schematic plan view of the acoustic wave device according to the third preferred embodiment. In FIG. 15, acoustic wave resonators are schematically represented by polygons with two diagonal lines.

An acoustic wave device 50 includes a plurality of resonators including acoustic wave resonators. The acoustic wave device 50 is a filter device. More specifically, the acoustic wave device 50 is, for example, a band-pass filter. However, the acoustic wave device 50 may be a band elimination filter. In the present preferred embodiment, all of the plurality of resonators are acoustic wave resonators. Each of the acoustic wave resonators of the acoustic wave device 50 includes an IDT electrode. Each of the IDT electrodes includes a pair of busbars and a plurality of electrode fingers defining and functioning as functional electrodes. In the present preferred embodiment, a first electrode film 58 and a second electrode film 59 are wiring electrode films. The first region E1 is a region overlapping the first electrode film 58 in plan view. The second region E2 is a region overlapping the second electrode film 59 in plan view. The third region E3 is a region not overlapping the first electrode film 58 or the second electrode film 59 in plan view.

The first electrode film 58 and the second electrode film 59 are disposed on the piezoelectric layer 14, and the plurality of acoustic wave resonators are arranged on the piezoelectric layer 14. The acoustic wave resonator from which the wiring electrode film defining and functioning as the first electrode film 58 is extended and the acoustic wave resonator from which the wiring electrode film defining and functioning as the second electrode film 59 is extended are different from each other. In other words, the first electrode film 58 and the second electrode film 59 are connected to the plurality of electrode fingers defining and functioning as functional electrodes by a busbar. The first electrode film 58 is connected to the hot potential, and the second electrode film 59 is connected to the ground potential.

Figure 16:
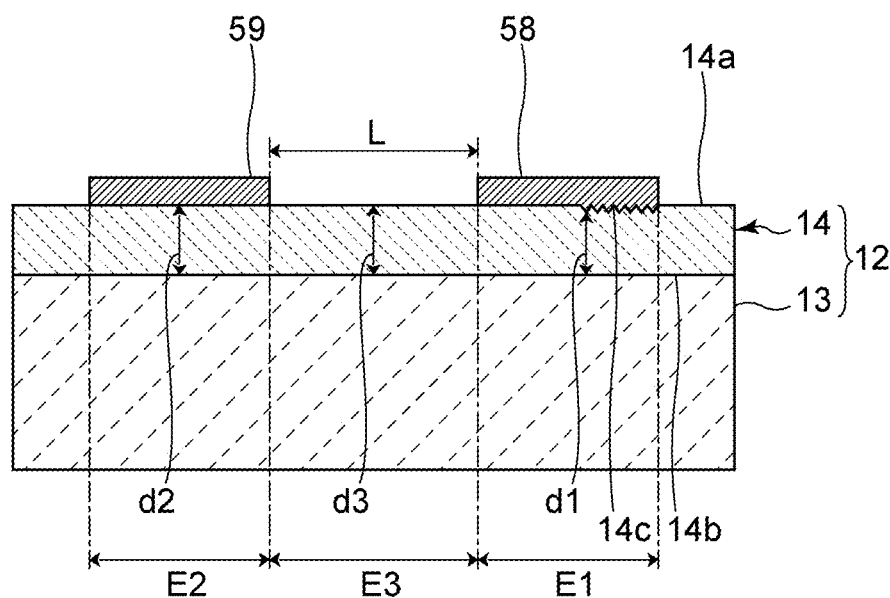
FIG. 16 is a sectional view taken along line of FIG. 15.

FIG. 16 is a sectional view taken along line III-III of FIG. 15.

The first electrode film 58 and the second electrode film 59 face each other. As in the first preferred embodiment, the uneven portion 14c is provided in a portion of the first region E1. On the other hand, the uneven portion 14c is not provided in either the second region E2 or the third region E3. The thickness d1 of the piezoelectric layer 14 in a portion of the first region E1 is different from the thickness d3 of the piezoelectric layer 14 in the third region E3. Thus, as in the first preferred embodiment, the propagation mode of a bulk wave in the first region E1 and the propagation mode of a bulk wave in the third region E3 can be set to be different from each other. Thus, the ripple in the frequency characteristics can be reduced or prevented. The circuit configuration in the present preferred embodiment will be described below.

Figure 17:
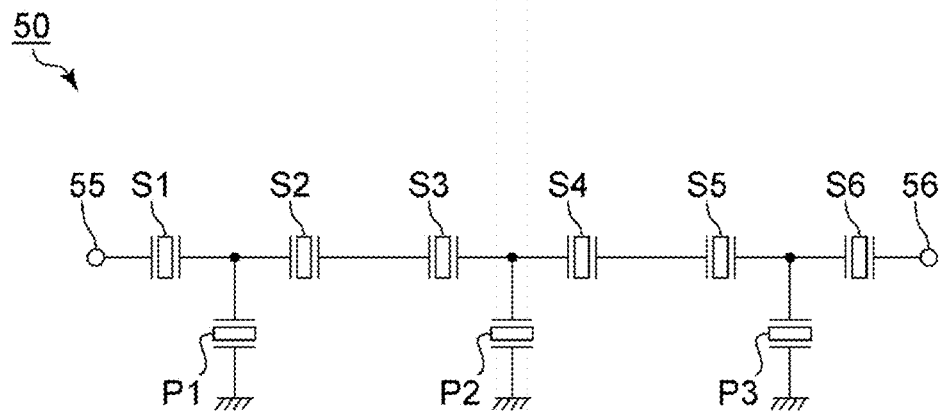
FIG. 17 is a circuit diagram of the acoustic wave device according to the third preferred embodiment of the present invention.

FIG. 17 is a circuit diagram of the acoustic wave device according to the third preferred embodiment of the present invention.

The acoustic wave device 50 is, for example, a ladder filter. In the present preferred embodiment, the plurality of acoustic wave resonators include a serial arm resonator S1, a serial arm resonator S2, a serial arm resonator S3, a serial arm resonator S4, a serial arm resonator S5, and a serial arm resonator S6, a parallel arm resonator P1, a parallel arm resonator P2, and a parallel arm resonator P3. The acoustic wave device 50 further includes a first signal terminal 55 and a second signal terminal 56.

The serial arm resonator S1, the serial arm resonator S2, the serial arm resonator S3, the serial arm resonator S4, the serial arm resonator S5, and the serial arm resonator S6 are connected in series to one another in this order between the first signal terminal 55 and the second signal terminal 56. The parallel arm resonator P1 is connected between a connection point between the serial arm resonator S1 and the serial arm resonator S2 and the ground potential. The parallel arm resonator P2 is connected between a connection point between the serial arm resonator S3 and the serial arm resonator S4 and the ground potential. The parallel arm resonator P3 is connected between a connection point between the serial arm resonator S5 and the serial arm resonator S6 and the ground potential. As illustrated in FIG. 15, the acoustic wave device 50 includes a plurality of ground terminals 57. Each of the parallel arm resonators is connected to the ground terminal through one of the ground terminals 57. The above-described circuit configuration is an example, and the circuit configuration of the acoustic wave device 50 is not particularly limited.

In the acoustic wave device 50, the first electrode film 58 is the wiring electrode film connecting the serial arm resonator S1 and the parallel arm resonator P1 to each other. The second electrode film 59 is the wiring electrode film connecting the parallel arm resonator P2 and the corresponding ground terminal 57 to each other. A distance L between the first electrode film 58 and the second electrode film 59 has a length different from aperture lengths M of the acoustic wave resonators excluding the acoustic wave resonators to which the first electrode film 58 and the second electrode film 59 are connected. The aperture length of an acoustic wave resonator refers to the distance between a pair of busbars of the acoustic wave resonator. As illustrated in FIG. 15, for example, the aperture length of the serial arm resonator S3 is denoted by M3, and the aperture length of the serial arm resonator S6 is denoted by M6. For example, the distance L may be longer or shorter than the shortest aperture length among the aperture lengths M of the acoustic wave resonators excluding the acoustic wave resonators to which the first electrode film 58 and the second electrode film 59 are connected. In the case where the aperture length M6 is not constant as in the serial arm resonator S6, for example, the distance L may be longer or shorter than the shortest aperture length among the aperture lengths M6.

The IDT electrode of the serial arm resonator S1 and the IDT electrode of the parallel arm resonator P1 are connected to the first electrode film 58, which is one of the first and second electrode films 58 and 59. In contrast, the IDT electrode of the parallel arm resonator P2 is connected to the second electrode film 59. An IDT electrode that is connected to both the first electrode film 58 and the second electrode film 59 may be provided.

Figure 18:
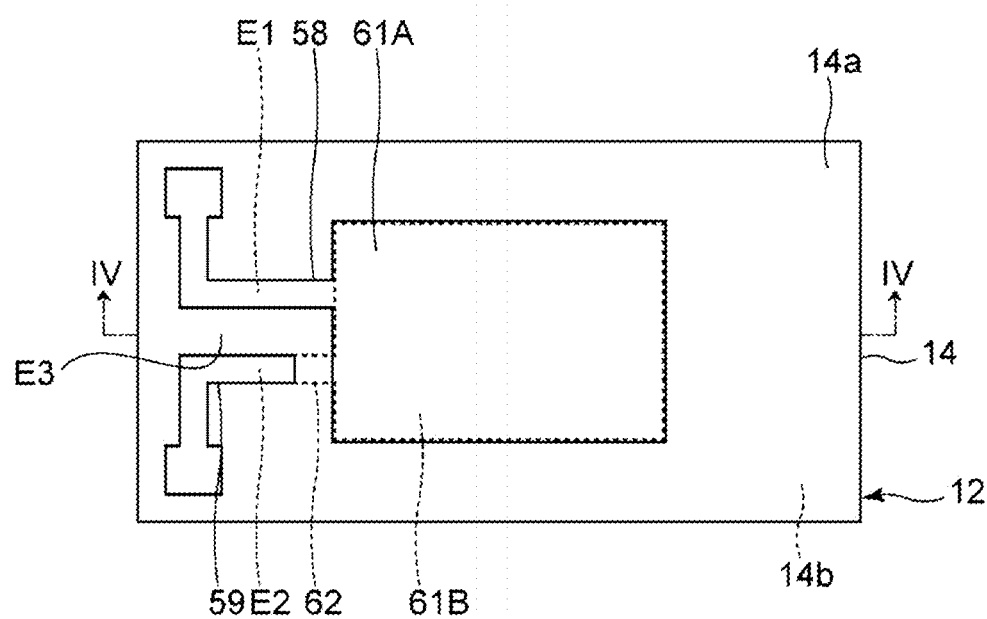
FIG. 18 is a plan view of an acoustic wave device according to a fourth preferred embodiment of the present invention.
Figure 19:
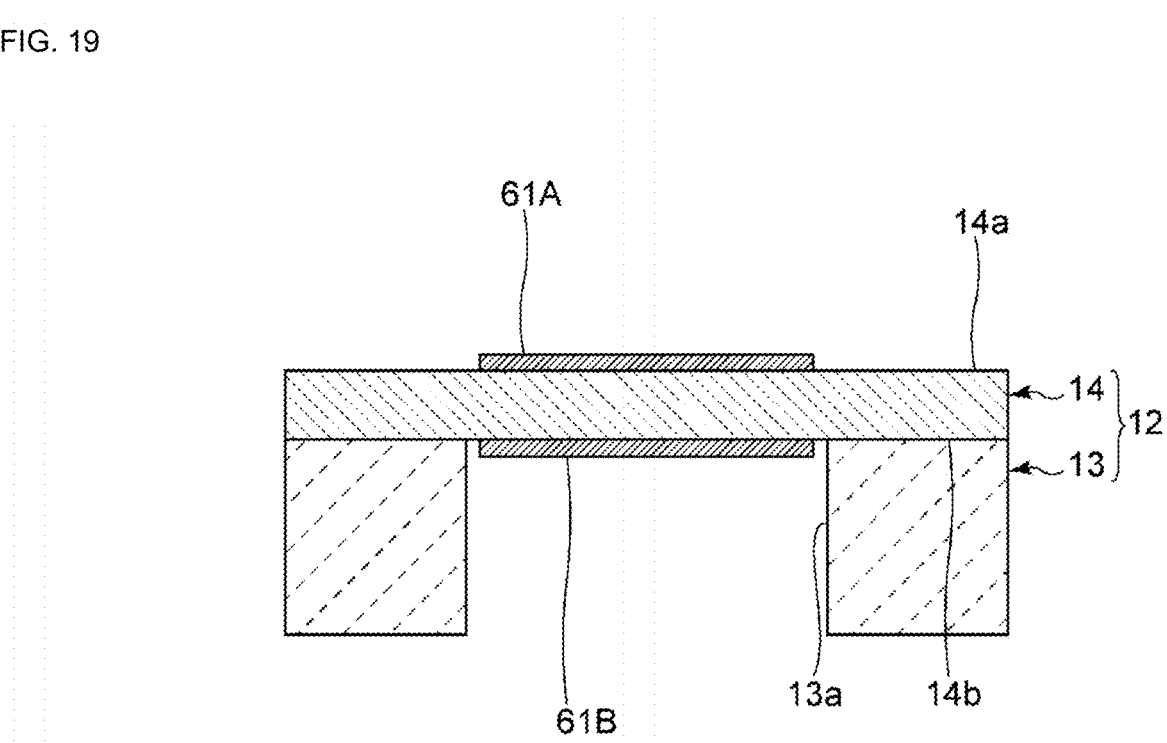
FIG. 19 is a sectional view taken along line IV-IV of FIG. 18.

FIG. 18 is a plan view of an acoustic wave device according to a fourth preferred embodiment of the present invention. FIG. 19 is a sectional view taken along line IV-IV of FIG. 18.

As illustrated in FIG. 18 and FIG. 19, in the present preferred embodiment, a functional electrode includes an upper electrode 61A and a lower electrode 61B. The upper electrode 61A is provided on the first main surface 14a of the piezoelectric layer 14. The lower electrode 61B is provided on a second main surface 14b of the piezoelectric layer 14. The upper electrode 61A and the lower electrode 61B face each other with the piezoelectric layer 14 interposed therebetween. The upper electrode 61A and the lower electrode 61B are connected to different potentials. A region in which the upper electrode 61A and the lower electrode 61B face each other is an excitation region.

As illustrated in FIG. 18, the first electrode film 58 and the second electrode film 59 are provided on the first main surface 14a of the piezoelectric layer 14. In the present preferred embodiment, the first electrode film 58 and the second electrode film 59 are wiring electrode films. The first electrode film 58 is connected to the upper electrode 61A. In contrast, a connection electrode 62 is provided on or in the second main surface 14b of the piezoelectric layer 14. The connection electrode 62 is connected to the lower electrode 61B. The piezoelectric layer 14 includes a through hole. The connection electrode 62 is connected to the second electrode film 59 by passing through the through hole. Thus, the second electrode film 59 is connected to the lower electrode 61B by the connection electrode 62.

The first electrode film 58 and the second electrode film 59 face each other. In the present preferred embodiment, as in the configuration of the third preferred embodiment illustrated in FIG. 16, the first region E1, the second region E2, and a third region of the piezoelectric layer 14 are defined. In other words, the uneven portion 14c is provided in a portion of the first region E1. On the other hand, the uneven portion 14c is not provided in either the second region E2 or the third region E3. The thickness d1 of the piezoelectric layer 14 in a portion of the first region E1 is different from the thickness d3 of the piezoelectric layer 14 in the third region E3. Thus, the propagation mode of a bulk wave in the first electrode film 58 and the propagation mode of a bulk wave in the second electrode film 59 can be set to be different from each other. Thus, the ripple in the frequency characteristics can be reduced or prevented.

A bulk acoustic wave (BAW) device such as the acoustic wave device of the present preferred embodiment may be applied to a filter device such as that illustrated in FIG. 15. In this case, as in the third preferred embodiment, the first electrode film and the second electrode film may be wiring electrode films connected to different acoustic wave resonators.

The thickness shear mode and a plate wave will be described in detail below. A support member in the following case corresponds to a support substrate.

Figure 20A:
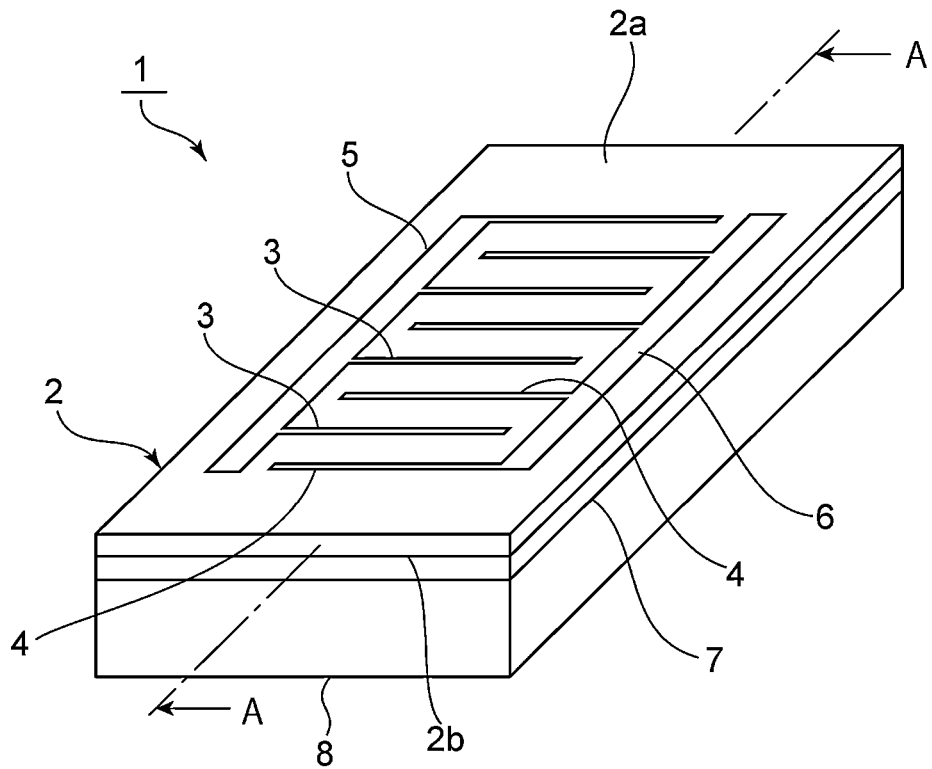
FIG. 20A is a schematic perspective view illustrating the appearance of an acoustic wave device that uses a thickness-shear mode bulk wave.
Figure 20B:
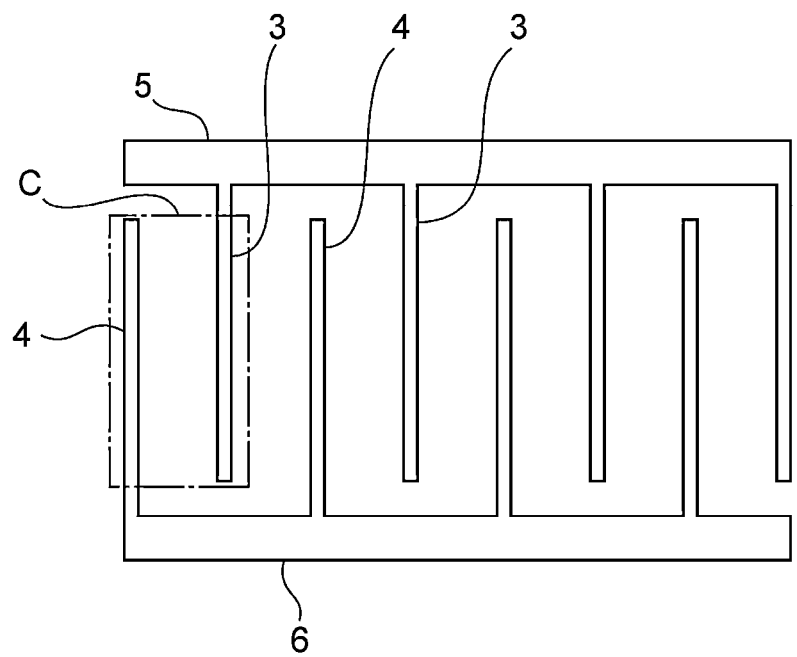
FIG. 20B is a plan view illustrating an electrode structure on a piezoelectric layer.
Figure 21:
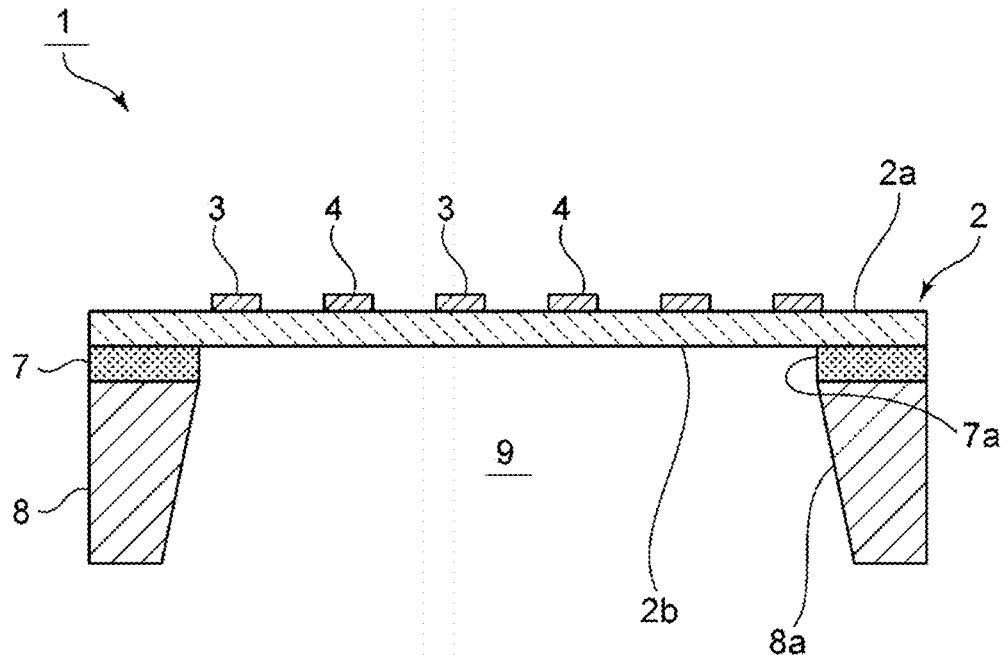
FIG. 21 is a sectional view taken along line A-A of FIG. 20A.

FIG. 20A is a schematic perspective view illustrating the appearance of an acoustic wave device that uses a thickness-shear mode bulk wave, and FIG. 20B is a plan view illustrating an electrode structure on a piezoelectric layer. FIG. 21 is a sectional view taken along line A-A of FIG. 20A.

An acoustic wave device 1 includes a piezoelectric layer 2 made of, for example, LiNbO₃. The piezoelectric layer 2 may be made of, for example. LiTaO₃. Regarding the cut-angles of LiNbO₃ and LiTaO₃, although Z-cut is used, rotated Y-cut or X cut may be used. Although the thickness of the piezoelectric layer 2 is not particularly limited, the thickness of the piezoelectric layer 2 is preferably, for example, about 40 nm or more and about 1,000 nm or less and more preferably, for example, about 50 nm or more and about 600 nm or less in order to effectively excite the thickness shear mode. The piezoelectric layer 2 includes a first main surface 2a and a second main surface 2b facing each other. Electrodes 3 and electrodes 4 are arranged on the first main surface 2a. Here, each of the electrodes 3 is an example of a "first electrode", and each of the electrodes 4 is an example of a "second electrode". In FIG. 20A and FIG. 20B, the plurality of electrodes 3 are connected to a first busbar 5. The plurality of electrodes 4 are connected to a second busbar 6. The plurality of electrodes 3 and the plurality of electrodes 4 are interdigitated with one another. The electrodes 3 and the electrodes 4 each have a rectangular or substantially rectangular shape and each have a length direction. The electrodes 3 and the electrodes 4 face one another in a direction perpendicular or substantially perpendicular to the length direction. The length direction of the electrodes 3 and 4 and the direction perpendicular or substantially perpendicular to the length direction of the electrodes 3 and 4 cross the thickness direction of the piezoelectric layer 2. Accordingly, it can also said that the electrodes 3 and the adjacent electrodes 4 face one another in a direction crossing the thickness direction of the piezoelectric layer 2. In addition, the length direction of the electrodes 3 and 4 and a direction perpendicular or substantially perpendicular to the length direction of the electrodes 3 and 4 illustrated in FIGS. 20A and 20B are interchangeable. In other words, in FIGS. 20A and 20B, the electrodes 3 and 4 may extend in the direction in which the first busbar 5 and the second busbar 6 extend. In this case, the first busbar 5 and the second busbar 6 extend in the direction in which the electrodes 3 and 4 extend in FIGS. 20A and 20B. The electrodes 3 are connected to one potential, and the electrodes 4 are connected to another potential. Each of the electrodes 3 is paired with one of the electrodes 4 that is adjacent to the electrode 3, and these pairs of electrodes 3 and 4 are arranged in the direction perpendicular or substantially perpendicular to the length direction of the electrodes 3 and 4. Here, when one of the electrodes 3 and the corresponding electrode 4 are adjacent to each other, the electrode 3 and the electrode 4 are arranged so as not to be in direct contact with each other but so as to be spaced apart from each other. In addition, when one of the electrodes 3 and the corresponding electrode 4 are adjacent to each other, electrodes including the other electrodes 3 and 4 that are connected to a hot electrode or a ground electrode are not located between the electrode 3 and the electrode 4. The number of the pairs does not need to be an integer and may be, for example, 1.5, 2.5, or the like. It is preferable that the center-to-center distance between each pair of the electrodes 3 and 4, that is, the pitch of the electrodes 3 and 4, is, for example, within a range of about 1 μm or more to about 10 μm or less. The width of each of the electrodes 3 and 4, that is, a dimension of each of the electrodes 3 and 4 in the direction in which the electrodes 3 and 4 face one another, is preferably, for example, within a range of about 50 nm or more to about 1,000 nm or less and more preferably, for example, within a range of about 150 nm or more to about 1,000 nm or less. The center-to-center distance between each pair of the electrodes 3 and 4 corresponds to the distance from the center of a dimension (width dimension) of the electrode 3 in a direction perpendicular or substantially perpendicular to the length direction of the electrode 3 to the center of a dimension (width dimension) of the electrode 4 in a direction perpendicular or substantially perpendicular to the length direction of the electrode 4.

In the acoustic wave device 1, a Z-cut piezoelectric layer is used, and thus, the direction perpendicular or substantially perpendicular to the length direction of the electrodes 3 and 4 is a direction perpendicular or substantially perpendicular to the polarization direction of the piezoelectric layer 2 unless a different cut piezoelectric body is used as the piezoelectric layer 2. Here, the term "perpendicular" is not limited to referring to being exactly perpendicular may refer to being substantially perpendicular (the angle formed by the direction perpendicular to the length direction of the electrodes 3 and 4 and the polarization direction is, for example, within a range of about 90°±10°).

A support member 8 is stacked on the second main surface 2b of the piezoelectric layer 2 with an insulating layer 7 interposed therebetween. The insulating layer 7 and the support member 8 each have a frame shape, and as illustrated in FIG. 21, through holes 7a and 8a are respectively provided in the insulating layer 7 and the support member 8, so that a cavity portion 9 is provided. The cavity portion 9 is provided in order not to hinder vibration of the excitation regions C of the piezoelectric layer 2. Thus, the support member 8 is stacked on the second main surface 2b with the insulating layer 7 interposed therebetween and located at a position at which it does not overlap a portion where at least one of the pairs of electrodes 3 and 4 are provided. The insulating layer 7 does not need to be provided. Accordingly, the support member 8 may be stacked directly or indirectly on the second main surface 2b of the piezoelectric layer 2.

The insulating layer 7 is made of, for example, a silicon oxide. However, a suitable insulating material such as, for example, silicon oxynitride or alumina can be used other than a silicon oxide. The support member 8 is made of, for example, Si. The plane orientation of a surface of the Si, the surface facing the piezoelectric layer 2, may be, for example, (100), (110), or (111). The Si of the support member 8 preferably has a high resistivity, which is, for example, about 2 kΩ or higher, and more preferably has a higher resistivity, which is, for example, about 4 kΩ) or higher. The support member 8 may also be made by using a suitable insulating material or a suitable semiconductor material.

The plurality of electrodes 3 and 4 and the first and second busbars 5 and 6 are made of, for example, a suitable metal such as Al or a suitable alloy such as an AlCu alloy. In the present preferred embodiment, the electrodes 3 and 4 and the first and second busbars 5 and 6 each have a structure in which an Al film is laminated on a Ti film. A close-contact layer that is not a Ti film may be used.

When the acoustic wave device 1 is driven, an AC voltage is applied between the plurality of electrodes 3 and the plurality of electrodes 4. More specifically, the AC voltage is applied between the first busbar 5 and the second busbar 6. As a result, resonance characteristics using a thickness-shear mode bulk wave that is excited in the piezoelectric layer 2 can be obtained. In the acoustic wave device 1, when the thickness of the piezoelectric layer 2 is denoted by d and the center-to-center distance between each pair of the electrodes 3 and 4, which are adjacent to each other, is denoted by p, d/p is, for example, about 0.5 or smaller. As a result, the above-mentioned thickness-shear mode bulk wave is effectively excited, and favorable resonance characteristics can be obtained. More preferably, d/p is, for example, about 0.24 or smaller, and in this case, more favorable resonance characteristics can be obtained.

Since the acoustic wave device 1 has the above-described configuration, even if the number of the pairs of electrodes 3 and 4 is reduced so as to facilitate a reduction in the size of the acoustic wave device 1, the Q value is less likely to be reduced. This is because the propagation loss will be small even if the number of electrode fingers of reflectors on both sides is reduced. The number of the electrode fingers can be reduced because a thickness-shear mode bulk wave is used. The difference between a Lamb wave used in an acoustic wave device and the thickness-shear mode bulk wave will now be described with reference to FIGS. 22A and 22B.

Figure 22A:
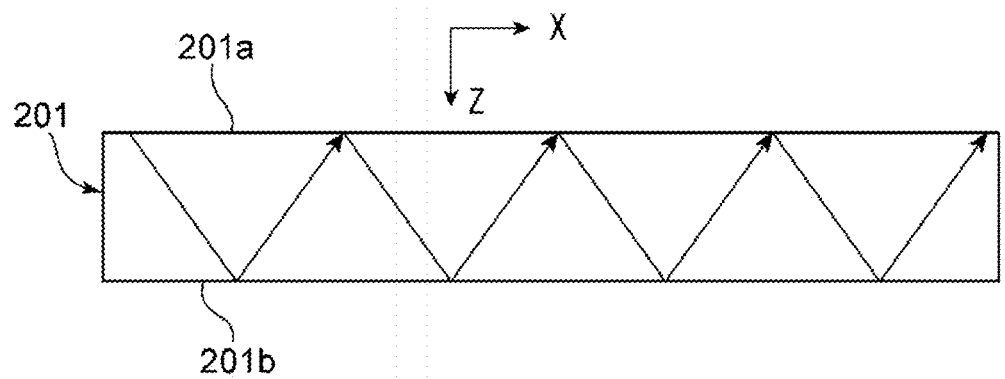
FIG. 22A is a schematic elevational cross-sectional view illustrating a Lamb wave that propagates through a piezoelectric film of an acoustic wave device.

FIG. 22A is a schematic elevational cross-sectional view illustrating a Lamb wave that propagates through a piezoelectric film of an acoustic wave device such as that described in Japanese Unexamined Patent Application Publication No. 2012-257019. In FIG. 22A, a wave propagates through a piezoelectric film 201 as indicated by arrows. The piezoelectric film 201 includes a first main surface 201a and a second main surface 201b facing each other, and a thickness direction connecting the first main surface 201a and the second main surface 201b to each other is the Z direction. The X direction is a direction in which electrode fingers of an IDT electrode are arranged. The Lamb wave propagates in the X direction as illustrated in FIG. 22A. Although the entire piezoelectric film 201 vibrates because the Lamb wave is a type of plate waves, the wave propagates in the X direction, and thus, the reflectors are arranged on both sides so as to obtain resonance characteristics. Consequently, a propagation loss of the wave occurs, and if the size reduction is facilitated, that is, if the number of pairs of electrode fingers is reduced, the Q value is reduced.

Figure 22B:
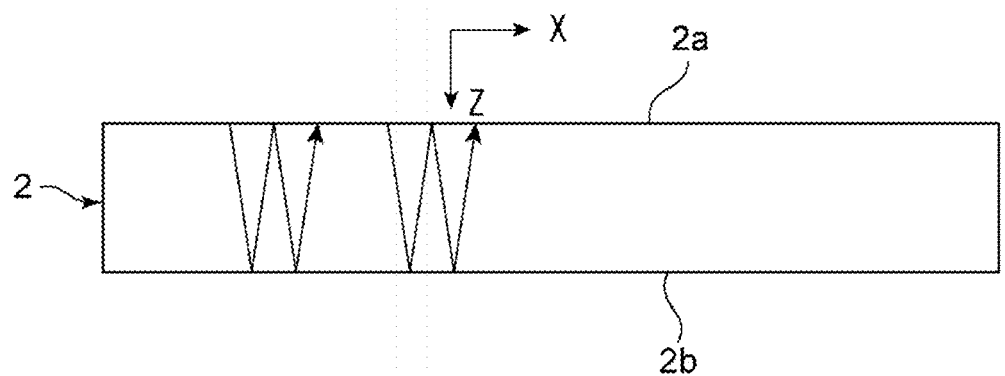
FIG. 22B is a schematic elevational cross-sectional view illustrating the thickness-shear mode bulk wave that propagates through the piezoelectric film of the acoustic wave device.

In contrast, as illustrated in FIG. 22B, in the acoustic wave device 1, the vibration displacement direction is the same or substantially the same as the thickness shear direction, and thus, the wave propagates and resonates substantially in a direction connecting the first main surface 2a and the second main surface 2b of the piezoelectric layer 2 to each other, that is, the Z direction. In other words, an X-direction component of the wave is considerably smaller than a Z-direction component of the wave. The resonance characteristics are obtained as a result of the wave propagating in the Z direction, and thus, a propagation loss is less likely to occur even if the number of electrode fingers of the reflectors is reduced. In addition, even if the number of pairs of electrode fingers including the electrodes 3 and 4 is reduced so as to facilitate the size reduction, the Q value is less likely to be reduced.

Figure 23:
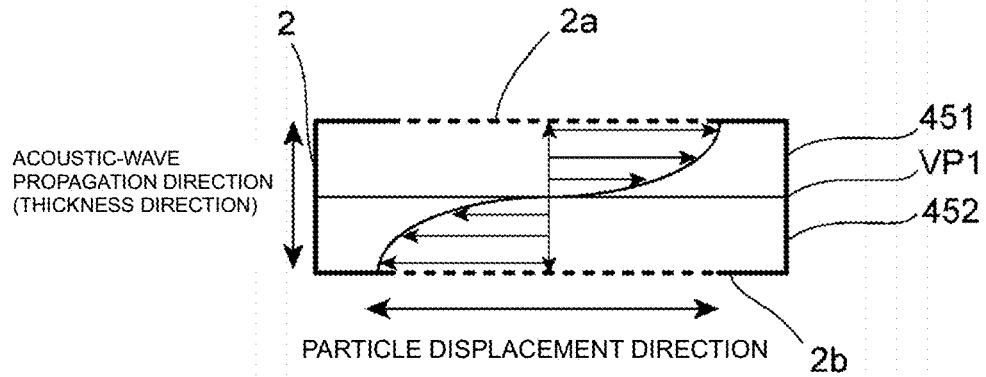
FIG. 23 is a diagram illustrating the amplitude direction of the thickness-shear mode bulk wave.

As illustrated in FIG. 23, the amplitude direction of thickness-shear mode bulk wave in a first region 451 that is included in the excitation regions C of the piezoelectric layer 2 is opposite to the amplitude direction of thickness-shear mode bulk wave in a second region 452 that is included in the excitation regions of the piezoelectric layer 2. FIG. 23 schematically illustrates a bulk wave in the case where a voltage is applied between the electrodes 3 and 4, the voltage causing the potential of the electrode 4 to become higher than that of the electrode 3. The first region 451 is one of the excitation regions and is a region between a virtual plane VP1 that is perpendicular or substantially perpendicular to the thickness direction of the piezoelectric layer 2 and that divides the piezoelectric layer 2 into two portions and the first main surface 2a. The second region 452 is one of the excitation regions and is a region between the virtual plane VP1 and the second main surface 2b.

As described above, at least one pair of electrodes including one of the electrodes 3 and a corresponding one of the electrodes 4 are arranged in the acoustic wave device 1. However, this does not cause a wave to propagate in the X direction, and thus, the number of pairs of the electrodes 3 and 4 does not need to be two or more. In other words, it is only necessary that at least one pair of electrodes are provided.

For example, the electrodes 3 are electrodes connected to the hot potential, and the electrodes 4 are electrodes connected to the ground potential. However, the electrodes 3 may be connected to the ground potential, and the electrodes 4 may be connected to the hot potential. In the present preferred embodiment, as described above, at least one pair of electrodes are electrodes connected to the hot potential and electrodes connected to the ground potential, and no floating electrode is provided.

Figure 24:
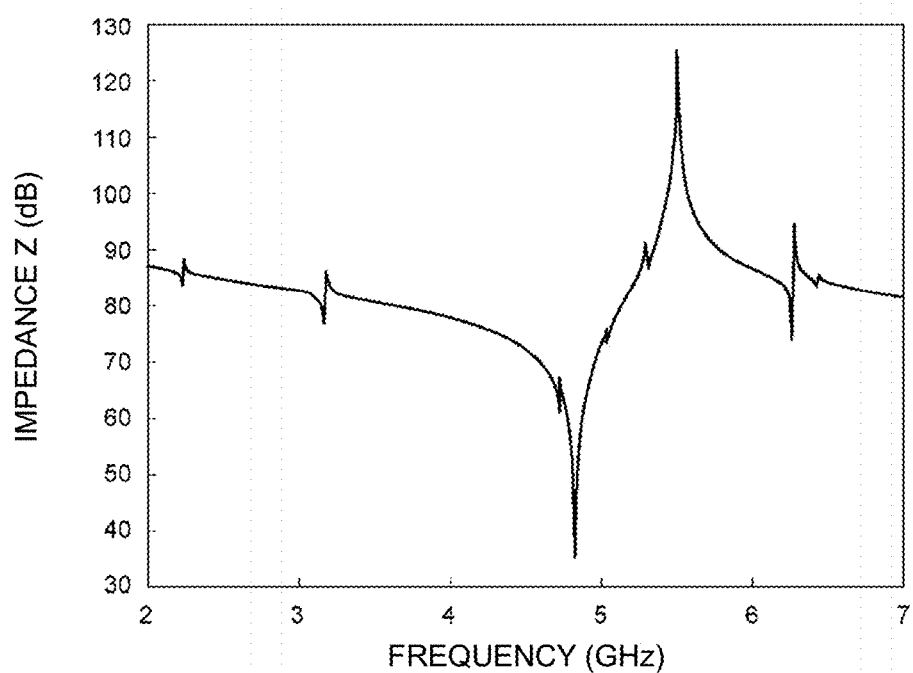
FIG. 24 is a graph illustrating a resonance characteristic of the acoustic wave device that uses the thickness-shear mode bulk wave.

FIG. 24 is a graph illustrating a resonance characteristic of the acoustic wave device illustrated in FIG. 21. The design parameters of the acoustic wave device 1 that has obtained this resonance characteristic are as follows.

The piezoelectric layer 2: $LiNbO_3$ with Euler angles of (0°, 0°, 90°), thickness=about 400 nm.

The length of a region in which the electrodes 3 and the electrodes 4 overlap one another when viewed in the direction perpendicular or substantially perpendicular to the length direction of the electrodes 3 and 4, that is, the sum of the lengths of the excitation regions C=about 40 μm, the number of pairs of electrodes formed of the electrodes 3 and 4=21, the center-to-center distance between each pair of electrodes=about 3 μm, the width of each of the electrodes 3 and 4=about 500 nm, d/p=about 0.133.

The insulating layer 7: a silicon oxide film having a thickness of about 1 μm.

The support member 8: Si

The length of each of the excitation regions C is a dimension of the excitation region C along the length direction of the electrodes 3 and 4.

In the present preferred embodiment, the electrode-to-electrode distances in the plurality of pairs of electrodes including the electrodes 3 and 4 were set to be the same as one another. In other words, the electrodes 3 and the electrodes 4 were arranged at the same or substantially the same pitch.

As is clear from FIG. 24, despite the fact that no reflectors are provided, a favorable resonance characteristic, which is a fractional bandwidth of about 12.5%, is obtained.

As described above, in the present preferred embodiment, d/p is, for example, about 0.5 or smaller and more preferably about 0.24 or smaller, where d is the thickness of the piezoelectric layer 2 and p is the center-to-center distance between each of the electrodes 3 and the corresponding electrode 4. This matter will now be described with reference to FIG. 25.

Figure 25:
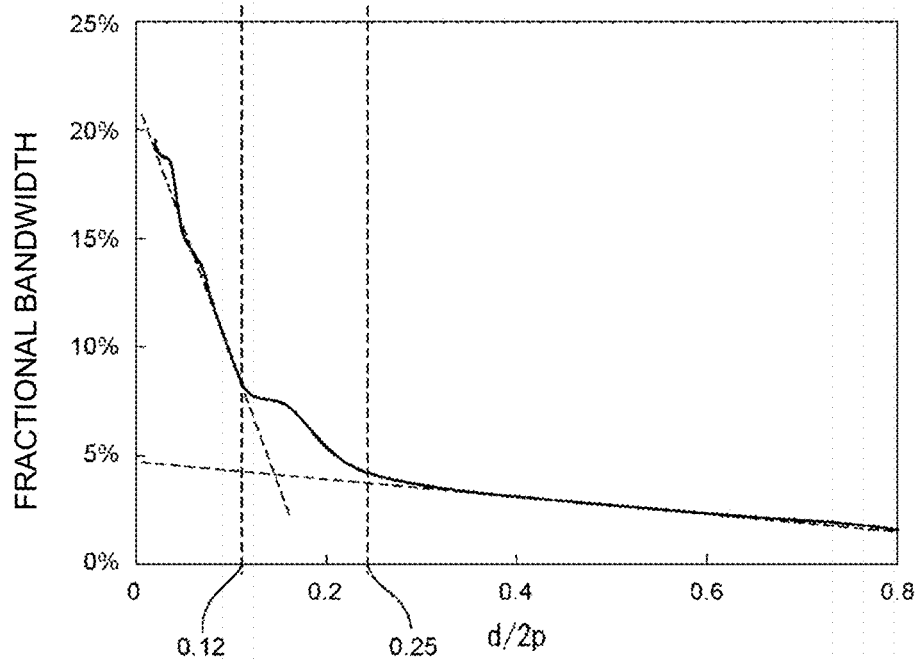
FIG. 25 is a graph illustrating the relationship between d/2p and the fractional bandwidth of each acoustic wave device as a resonator, where p is the center-to-center distance between adjacent electrodes and d is the thickness of the piezoelectric layer.

A plurality of acoustic wave devices were obtained in a manner similar to the acoustic wave device that has obtained the resonance characteristic illustrated in FIG. 24 except that d/2p was varied. FIG. 25 is a graph illustrating the relationship between the d/2p and the fractional bandwidth of each of the acoustic wave devices as a resonator.

As is clear from FIG. 25, when d/2p exceeds about 0.25, that is, d/p>about 0.5, the fractional bandwidth is less than about 5% even if d/p is changed. In contrast, in the case of d/2p≤about 0.25, that is, d/p≤about 0.5, the fractional bandwidth can be improved to about 5% or higher by changing d/p within the range. In other words, a resonator having a high coupling coefficient can be provided. In addition, when d/2p is about 0.12 or smaller, that is, d/p is about 0.24 or smaller, the fractional bandwidth can be improved to about 7% or higher. In this case, by changing d/p within the range, a resonator having an even wider fractional bandwidth can be obtained, and a resonator having an even higher coupling coefficient can be achieved. Thus, it is understood that a resonator that uses the thickness-shear mode bulk wave and that has a high coupling coefficient can be provided by setting d/p to be about 0.5 or smaller.

As described above, the at least one pair of electrodes may be a single pair of electrodes.

For example, if the piezoelectric layer 2 has a non-uniform thickness, a value obtained by averaging the thicknesses may be used.

Figure 26:
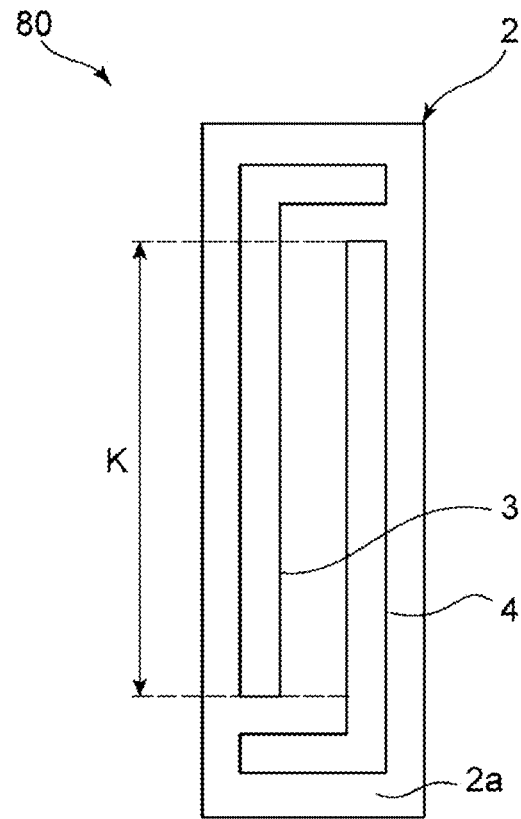
FIG. 26 is a plan view of an acoustic wave device that uses a thickness-shear mode bulk wave.

FIG. 26 is a plan view of an acoustic wave device that uses a thickness-shear mode bulk wave. In an acoustic wave device 80, a pair of electrodes 3 and 4 are provided on the first main surface 2a of the piezoelectric layer 2. An intersecting width is denoted by K in FIG. 26. As described above, in the acoustic wave device according to a preferred embodiment of the present invention, the number of pairs of electrodes may be one. Also in this case, a thickness-shear mode bulk wave can be effectively excited as long as d/p is about 0.5 or smaller.

Figure 27:
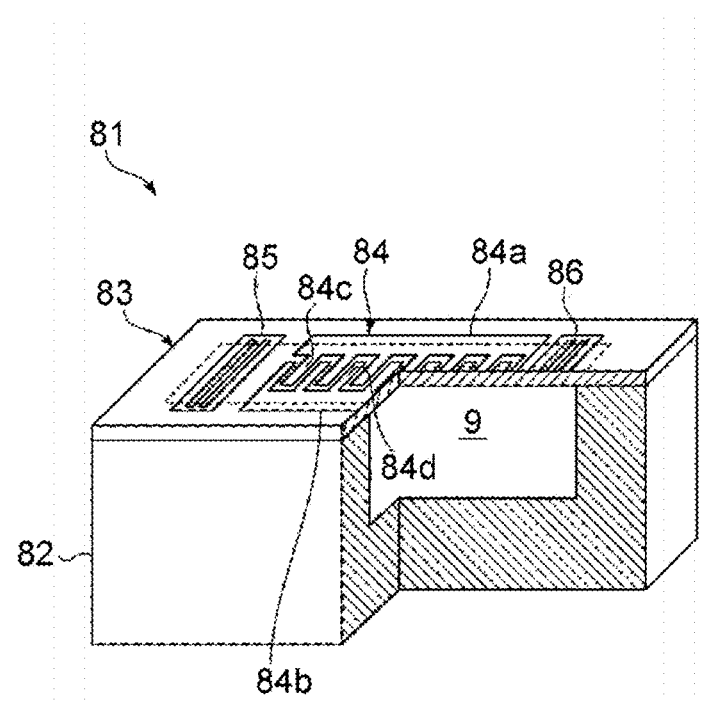
FIG. 27 is a partially cut-away perspective view illustrating an acoustic wave device that uses a Lamb wave.

FIG. 27 is a partially cut-away perspective view illustrating an acoustic wave device that uses a Lamb wave. The position of the cavity portion 9 when viewed from a piezoelectric layer 83 is indicated by a dashed line in FIG. 27.

An acoustic wave device 81 includes a support substrate 82. The support substrate 82 includes a recess that is open toward the upper surface thereof. The piezoelectric layer 83 is laminated on the support substrate 82, so that the cavity portion 9 is provided. An IDT electrode 84 is provided on the piezoelectric layer 83 so as to be located above the cavity portion 9. Reflectors 85 and 86 are provided on both sides of the IDT electrode 84 in an acoustic-wave propagation direction. In FIG. 27, the outer peripheral edge of the cavity portion 9 is indicated by the dashed line. Here, the IDT electrode 84 includes first and second busbars 84a and 84b, a plurality of electrodes 84c defining and functioning as first electrode fingers, and a plurality of electrodes 84d defining and functioning as second electrode fingers. The plurality of electrodes 84c are connected to the first busbar 84a. The plurality of electrodes 84d are connected to the second busbar 84b. The plurality of electrodes 84c and the plurality of electrodes 84d are interdigitated with one another.

In the acoustic wave device 81, a Lamb wave which is a type of plate waves is excited by applying an AC electric field to the IDT electrode 84 located above the cavity portion 9. In addition, since the reflectors 85 and 86 are provided on both sides, the resonance characteristics using the Lamb wave can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate;
   a piezoelectric layer on the support substrate;
   a functional electrode on the piezoelectric layer; and
   first and second electrode films positioned on the piezoelectric layer to face each other and having different potentials from each other; wherein
   a thickness of the piezoelectric layer in at least a portion of a region overlapping the first electrode film in plan view is different from a thickness of the piezoelectric layer in at least a portion of a region not overlapping the first electrode film in plan view;
   the functional electrode includes at least one pair of electrodes facing each other, and each of the at least one pair of electrodes is disposed between the first and second electrode films in plan view;
   the at least one pair of electrodes include a first electrode finger and a second electrode finger; and
   an end of the first electrode finger is connected to the first electrode film, and an end of the second electrode finger is connected to the second electrode film.

2. The acoustic wave device according to claim 1, wherein the piezoelectric layer includes an uneven portion in the at least a portion of the region overlapping the first electrode film in plan view, and the uneven portion includes a portion having a thickness different from a thickness of the piezoelectric layer in at least a portion of a region overlapping the second electrode film.

3. The acoustic wave device according to claim 2, wherein the uneven portion is a first uneven portion;
   the piezoelectric layer includes a second uneven portion in the at least a portion of the region overlapping the second electrode film in plan view; and
   a surface roughness of the first uneven portion and a surface roughness of the second uneven portion are different from each other.

4. The acoustic wave device according to claim 3, wherein the surface roughness of the first uneven portion is about 0.2 nm or greater.

5. The acoustic wave device according to claim 1, wherein the piezoelectric layer includes lithium niobate or lithium tantalate.

6. The acoustic wave device according to claim 5, wherein the acoustic wave device is structured to generate a thickness-shear mode bulk wave.

7. The acoustic wave device according to claim 6, wherein an interdigital transducer (IDT) electrode including the functional electrode and a pair of busbars is provided on the piezoelectric layer;
   the at least one pair of electrodes included in the functional electrode includes a plurality of electrode fingers of the IDT electrode, the plurality of electrode fingers including the first and second electrode fingers, at least one of the plurality of electrode fingers being connected to one of the busbars, and at least one of the plurality of electrode fingers excluding the at least one electrode finger being connected to the other busbar; and
   the one busbar is the first electrode film, and the other busbar is the second electrode film.

8. The acoustic wave device according to claim 5, wherein when the thickness of the piezoelectric layer is denoted by d and a center-to-center distance between the at least one pair of electrodes, which are adjacent to each other, is denoted by p, d/p is about 0.5 or smaller.

9. The acoustic wave device according to claim 5, wherein when the thickness of the piezoelectric layer is denoted by d and a center-to-center distance between the at least one pair of electrodes, which are adjacent to each other, is denoted by p, d/p is about 0.24 or smaller.

10. The acoustic wave device according to claim 1, wherein the thickness of the piezoelectric layer in the at least a portion of the region overlapping the first electrode film in plan view is different from a thickness of the piezoelectric layer in at least a portion of a region including a region overlapping a space between the first electrode film and the second electrode film in plan view and a region overlapping the second electrode film in plan view.

11. The acoustic wave device according to claim 1, wherein a thickness of the piezoelectric layer in an entirety or substantially an entirety of the region overlapping the first electrode film in plan view is different from a thickness of the piezoelectric layer in an entirety or substantially an entirety of a region overlapping the second electrode film in plan view.

12. The acoustic wave device according to claim 1, wherein
an IDT electrode including the functional electrode and a pair of busbars is provided on the piezoelectric layer;
the at least one pair of electrodes included in the functional electrode includes a plurality of electrode fingers of the IDT electrode, the plurality of electrode fingers including the first and second electrode fingers, at least one of the plurality of electrode fingers being connected to one of the busbars, and at least one of the plurality of electrode fingers excluding the at least one electrode finger being connected to the other busbar;
the one busbar is the first electrode film, and the other busbar is the second electrode film; and
the acoustic wave device is structured to generate a plate wave.

13. The acoustic wave device according to claim 1, wherein a dielectric film is provided between the piezoelectric layer and at least one of the first electrode film and the second electrode film.

14. The acoustic wave device according to claim 1, wherein
the acoustic wave device is a band-pass filter or a band elimination filter including a plurality of acoustic wave resonators; and
the plurality of acoustic wave resonators each include the functional electrode.

15. The acoustic wave device according to claim 1, wherein the acoustic wave device is structured to generate a shear horizontal wave.

16. The acoustic wave device according to claim 1, wherein
the acoustic wave device is a ladder filter including a plurality of acoustic wave resonators; and
the plurality of acoustic wave resonators include series arm resonators and parallel arm resonators.

17. The acoustic wave device according to claim 1, wherein the support substrate includes a through hole defining a cavity portion.

18. The acoustic wave device according to claim 1, wherein the support substrate is a silicon substrate.

19. An acoustic wave device comprising:
a support substrate;
a piezoelectric layer on the support substrate;
a functional electrode on the piezoelectric layer; and
first and second electrode films positioned on the piezoelectric layer to face each other and having different potentials from each other; wherein
a thickness of the piezoelectric layer in at least a portion of a region overlapping the first electrode film in plan view is different from a thickness of the piezoelectric layer in at least a portion of a region not overlapping the first electrode film in plan view;
the piezoelectric layer includes a first main surface and a second main surface facing each other;
the first electrode film and the second electrode film are on or in the first main surface;
the functional electrode includes an upper electrode on or in the first main surface and a lower electrode on or in the second main surface; and
the upper electrode and the lower electrode face each other.

* * * * *